(12) United States Patent
Choi et al.

(10) Patent No.: US 11,849,605 B2
(45) Date of Patent: Dec. 19, 2023

(54) DISPLAY DEVICE HAVING PIXEL-DEFINING LAYERS

(71) Applicant: Samsung Display Co., Ltd., Yongin-si (KR)

(72) Inventors: Nakcho Choi, Yongin-si (KR); Daegi Kweon, Yongin-si (KR); Chiwook An, Yongin-si (KR); Jihee Kim, Yongin-si (KR); Yangho Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 284 days.

(21) Appl. No.: 17/182,963

(22) Filed: Feb. 23, 2021

(65) Prior Publication Data

US 2021/0376007 A1 Dec. 2, 2021

(30) Foreign Application Priority Data

Jun. 1, 2020 (KR) .......................... 10-2020-0066018

(51) Int. Cl.
*H10K 59/121* (2023.01)
*H10K 50/844* (2023.01)
*H10K 50/86* (2023.01)
*H10K 59/38* (2023.01)
*H10K 59/40* (2023.01)
(Continued)

(52) U.S. Cl.
CPC ......... *H10K 59/121* (2023.02); *H10K 50/844* (2023.02); *H10K 50/865* (2023.02); *H10K 59/122* (2023.02); *H10K 59/38* (2023.02); *H10K 59/40* (2023.02); *H10K 59/65* (2023.02); *H10K 71/00* (2023.02); *H10K 71/233* (2023.02)

(58) Field of Classification Search
CPC ............... H01L 27/322; H01L 27/3234; H01L 27/3246; H01L 51/5284
USPC .............................................. 257/40, 89, 79
See application file for complete search history.

(56) References Cited

U.S. PATENT DOCUMENTS 9,989,806 B2 6/2018 Lee et al.
10,367,045 B2 7/2019 Yang et al.
(Continued)

FOREIGN PATENT DOCUMENTS

EP 3823032 5/2021
JP 5519532 6/2014
(Continued)

*Primary Examiner* — Nduka E Ojeh
(74) *Attorney, Agent, or Firm* — H.C. Park & Associates, PLC

(57) ABSTRACT

A display device includes a main display area in which main display elements are arranged and a component area in which auxiliary display elements and a transmission area are arranged, the display device including: a first pixel-defining layer arranged in the main display area, the first pixel-defining being between first pixel electrodes of the main display elements; a second pixel-defining layer arranged in the component area, the second pixel-defining layer being between second pixel electrodes of the auxiliary display elements; a black matrix arranged on the main display elements, the black matrix being around emission areas of the main display elements; and color filters arranged on the main display elements and the auxiliary display elements, the color filters being arranged to correspond to the emission areas of the main display elements and emission areas of the auxiliary display elements, respectively.

26 Claims, 41 Drawing Sheets

(51) Int. Cl.
    *H10K 59/65*      (2023.01)
    *H10K 59/122*    (2023.01)
    *H10K 71/00*      (2023.01)
    *H10K 71/20*      (2023.01)

(56) References Cited

U.S. PATENT DOCUMENTS

| | | |
|---|---|---|
| 2012/0049175 A1 | 3/2012 | Ono et al. |
| 2016/0124254 A1* | 5/2016 | Yoon ................ G02F 1/1309 |
| | | 349/110 |
| 2017/0355313 A1 | 12/2017 | Park et al. |
| 2018/0294323 A1* | 10/2018 | Yang ................ H01L 27/3244 |
| 2019/0214440 A1 | 7/2019 | Lee et al. |
| 2019/0341428 A1 | 11/2019 | Lee et al. |
| 2020/0105841 A1* | 4/2020 | Bang ................ H01L 27/14678 |
| 2021/0013298 A1 | 1/2021 | Her et al. |
| 2021/0066648 A1* | 3/2021 | Chung ................ H10K 50/86 |
| 2021/0202588 A1* | 7/2021 | Cho ................ H01L 27/3202 |

FOREIGN PATENT DOCUMENTS

| | | |
|---|---|---|
| KR | 10-2017-003163 | 3/2017 |
| KR | 10-2017-0031613 | 3/2017 |
| KR | 10-201700141311 | 12/2017 |
| KR | 10-2018-0011982 | 2/2018 |
| WO | 2019199139 | 10/2019 |

\* cited by examiner

DISPLAY DEVICE HAVING PIXEL-DEFINING LAYERS

CROSS-REFERENCE TO RELATED APPLICATION

This application claims priority from and the benefit of Korean Patent Application No. 10-2020-0066018, filed on Jun. 1, 2020, which is hereby incorporated by reference for all purposes as if fully set forth herein.

BACKGROUND

Field

Exemplary embodiments of the invention relate generally to a display device, and more particularly, to a display panel in which transmittance is ensured in an area where an electronic component is arranged, and a display device including the same.

Discussion of the Background

Recently, the uses of display devices have been diversified. Furthermore, as the thickness and the weight of display devices decrease, the uses thereof have increased.

As the display devices are variously used, there may be various methods to design the shapes of the display devices and an increased number of functions to be applied or linked to the display devices.

The above information disclosed in this Background section is only for understanding of the background of the inventive concepts, and, therefore, it may contain information that does not constitute prior art.

SUMMARY

Devices constructed according to exemplary embodiments of the invention are capable of providing a display device in which transmittance is ensured in an area where a component that is an electronic element is arranged, and a display device including the same. However, it should be understood that embodiments described herein should be considered in a descriptive sense only and not for limitation of the embodiments.

Additional aspects will be set forth in part in the description which follows and, in part, will be apparent from the description, or may be learned by practice of the presented embodiments.

According to one or more embodiments, a display device includes a main display area in which main display elements are arranged and a component area in which auxiliary display elements and a transmission area are arranged, the display device including a first pixel-defining layer arranged in the main display area, the first pixel-defining being between first pixel electrodes of the main display elements, a second pixel-defining layer arranged in the component area, the second pixel-defining layer being between second pixel electrodes of the auxiliary display elements, a black matrix arranged on the main display elements, the black matrix being around emission areas of the main display elements, and color filters arranged on the main display elements and the auxiliary display elements, the color filters being arranged to correspond to the emission areas of the main display elements and emission areas of the auxiliary display elements, respectively.

The first pixel-defining layer may include an opaque material, and the second pixel-defining layer may include a transparent material.

The display device may further include a first spacer on the first pixel-defining layer, an insulating pattern arranged in the component area, and a second spacer on the insulating pattern.

The second pixel-defining layer may cover the insulating pattern, and the second spacer may be a portion of the second pixel-defining layer, which is arranged on the insulating pattern.

The second pixel-defining layer may be apart from the insulating pattern, and a slit may surround the insulating pattern between the second pixel-defining layer and the insulating pattern.

The display device may further include a first spacer on the first pixel-defining layer, and a second spacer which is a portion of the second pixel-defining layer, the second spacer being a portion protruding from the second pixel-defining layer.

Each of the first pixel-defining layer and the second pixel-defining layer may include an opaque material.

The second pixel-defining layer may include first insulating patterns surrounding edges of the second pixel electrodes.

The display device may further include a first spacer on the first pixel-defining layer, a second insulating pattern between the first insulating patterns, the second insulating pattern being apart from the first insulating patterns, and a second spacer on the second insulating pattern.

The second insulating pattern may include an opaque material, and each of the first spacer and the second spacer may include a transparent material.

The first pixel-defining layer may include third insulating patterns surrounding edges of the first pixel electrodes.

The display device may further include a fourth insulating pattern between the third insulating patterns, the fourth insulating pattern being apart from the third insulating patterns, a first spacer on the fourth insulating pattern, a second insulating pattern between the first insulating patterns, the second insulating pattern being apart from the first insulating patterns, and a second spacer on the second insulating pattern.

Each of the second insulating pattern and the fourth insulating pattern may include an opaque material, and each of the first spacer and the second spacer may include a transparent material.

The display device may further include a first spacer which is a portion of the first pixel-defining layer, the first spacer being a portion protruding from the first pixel-defining layer, and a second spacer between the first insulating patterns, the second spacer being apart from the first insulating patterns and including portions having different heights.

The second spacer may include an opaque material.

The display device may further include a first spacer between the third insulating patterns, the first spacer being apart from the third insulating patterns and including portions having different heights, and a second spacer between the first insulating patterns, the second spacer being apart from the first insulating patterns and including portions having different heights.

Each of the first spacer and the second spacer may include an opaque material.

An edge of the second pixel-defining layer in the component area may overlap an edge of the first pixel-defining layer in the main display area.

According to one or more embodiments, a display device includes a main display area in which main display elements are arranged and a component area in which auxiliary display elements and a transmission area are arranged, the display device including a first pixel-defining layer arranged in the main display area and covering edges of first pixel electrodes of the main display elements, a first spacer between the first pixel electrodes of the main display elements, a second pixel-defining layer arranged in the component area and covering edges of second pixel electrodes of the auxiliary display elements, and a second spacer between the second pixel electrodes of the auxiliary display elements.

The second spacer may be arranged on an insulating pattern between the second pixel electrodes of the auxiliary display elements.

The second pixel-defining layer may include insulating patterns surrounding the edges of the second pixel electrodes.

The second spacer may be between the insulating patterns and may include portions having different heights.

The second spacer may be a portion of the second pixel-defining layer, the second spacer being a portion protruding from the second pixel-defining layer.

The display device may further include a thin-film encapsulation layer arranged on the main display elements and the auxiliary display elements, a black matrix arranged on the thin-film encapsulation layer, the black matrix being around emission areas of the main display elements, and color filters arranged on the thin-film encapsulation layer, the color filters corresponding to the emission areas of the main display elements and emission areas of the auxiliary display elements, respectively.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
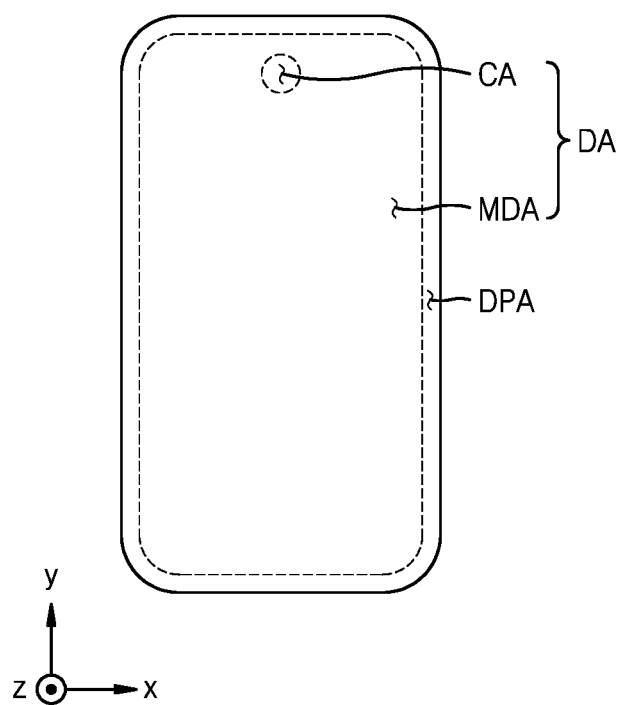
FIGS. 1 and 2 are schematic plan views of a display panel according to exemplary embodiments of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
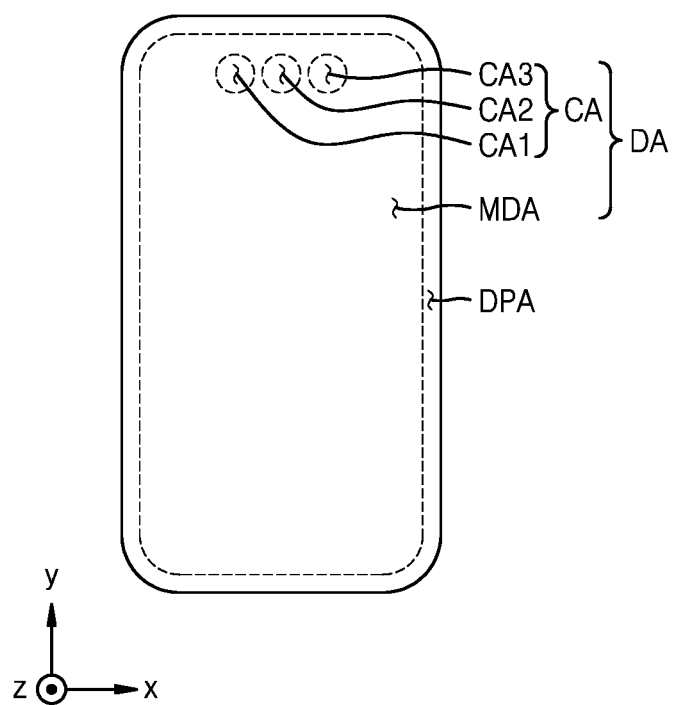

FIGS. 1 and 2 are schematic plan views of a display panel according to embodiments.

The display panel may be a light-emitting display panel including a light-emitting element. For example, the display panel may be an organic light-emitting display panel using an organic light-emitting diode (LED) including an organic emission layer, a micro LED display panel using a micro LED, a quantum dot light-emitting display panel using a quantum dot LED including a quantum dot emission layer, or an inorganic light-emitting display panel using an inorganic light-emitting element including an inorganic semiconductor.

The display panel may be a rigid display panel that is not easily bendable due to rigidity, or a flexible display panel that is easily bendable, foldable, or rollable due to flexibility. For example, the display panel may be a foldable display panel that may be folded and unfolded, a curved display panel having a curved display surface, a bended display panel having a curved area other than a display surface, a rollable display panel that may be rolled and unrolled, or a stretchable display panel that may be stretched.

The display panel includes a display area DA in which an image is implemented and a peripheral area DPA in which an image is not implemented. The display area DA includes a main display area MDA and a component area CA. The main display area MDA and the component area CA may display an image individually or together. The peripheral area DPA may be a non-display area in which display elements are not arranged. The display area DA may be entirely surrounded by the peripheral area DPA. A component, which is an electronic element, may be arranged under the component area CA.

The component may be a camera that uses infrared light or invisible light and may include an imaging device. Alternatively, the component may be a solar cell, a flash, an illuminance sensor, a proximity sensor, or an iris sensor. Alternatively, the component may receive sound. In order to minimize the limitation of functions of the component, the component area CA may include a transmission area through which light and/or sound output from the component to the outside or traveling toward the component from the outside may be transmitted.

In an embodiment, the component area CA may have a higher light transmittance and/or acoustic transmittance than those of the main display area MDA. In an embodiment, when light is transmitted through the component area CA, light transmittance may be about 10% or more, more preferably 25% or more, 30% or more, 50% or more, 75% or more, 80% or more, 85% or more, or 90% or more.

The component area CA may be arranged inside the main display area MDA and surrounded by the main display area MDA. In addition, the component area CA may be provided in a circular shape and may be provided as a single component area CA or a plurality of component areas CA. As an example, FIG. 1 shows one component area CA, and FIG. 2 shows three component areas CA, which are a first component area CA1, a second component area CA2, and a third component area CA3. The first to third component areas CA1 to CA3 each may be surrounded by the main display area MDA. A first component may be arranged to correspond to the first component area CA1, a second component may be arranged to correspond to the second component area CA2, and a third component may be arranged to correspond to the third component area CA3. The first to third components may have different functions. In an embodiment, a camera may be arranged in the first component area CA1, an illuminance sensor may be arranged in the second component area CA2, and a proximity sensor may be arranged in the third component area CA3.

In FIGS. 1 and 2, it is shown that the component area CA has a circular shape, but the embodiment is not limited thereto. For example, the component area CA may have an elliptical shape or a polygonal shape such as a triangle, a pentagon, etc., and a position and size of the component area CA may be variously modified.

Figure 3:
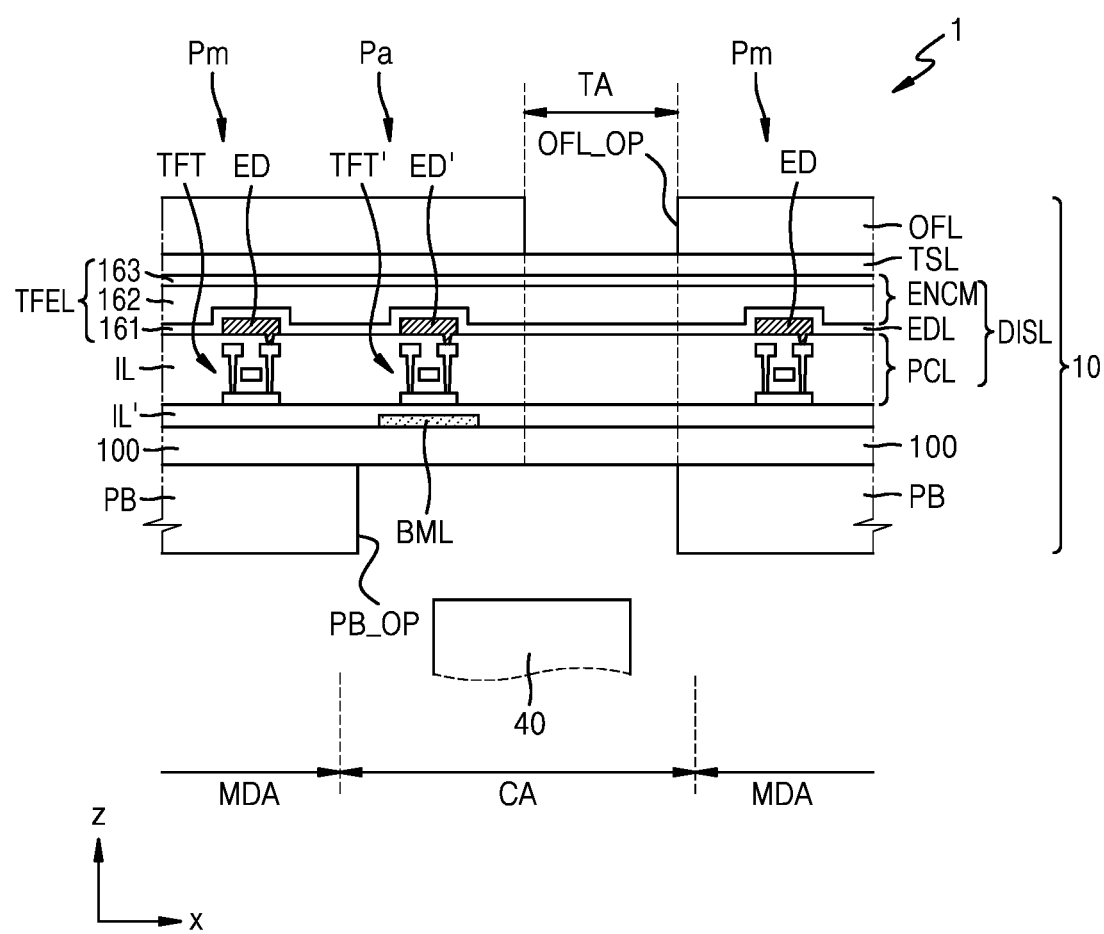
FIGS. 3 and 4 are schematic plan views of a portion of a cross-section of a display device according to exemplary embodiments of the invention.
Figure 4:
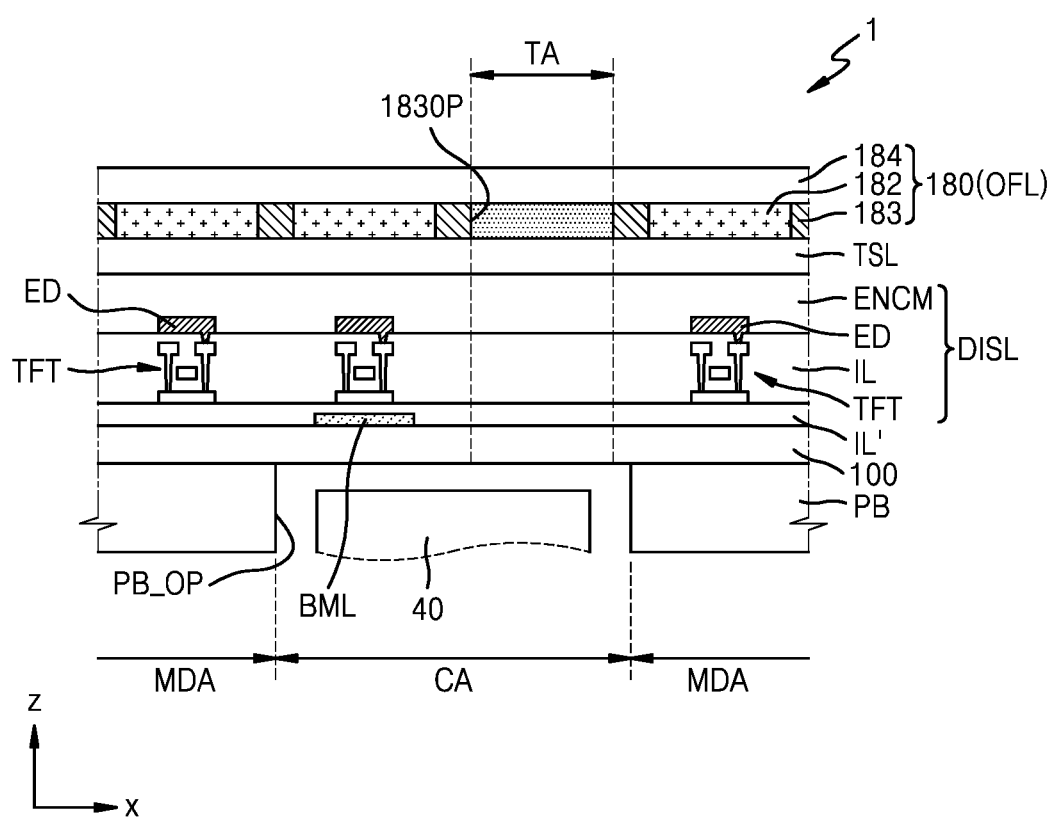

FIGS. 3 and 4 are schematic plan views of a portion of a cross-section of a display device 1 according to embodiments.

Referring to FIGS. 3 and 4, the display device 1 may include a display panel 10 and a component 40 overlapping the display panel 10. A cover window (not shown) that protects the display panel 10 may be further arranged on the display panel 10.

The display panel 10 may include a component area CA that overlaps the component 40 and a main display area MDA on which a main image is displayed. The display panel 10 may include a substrate 100, a display layer DISL on the substrate 100, a touchscreen layer TSL, an optical functional layer OFL, and a panel protection member PB under the substrate 100.

The display layer DISL may include a circuit layer PCL including thin-film transistors TFT and TFT', a display element layer EDL including light-emitting elements ED and ED', which are display elements, and an encapsulation member ENCM such as a thin-film encapsulation layer TFEL or a sealing substrate (not shown). Insulating layers IL and IL' may be between the substrate 100 and the display layer DISL, and inside the display layer DISL.

A main sub-pixel Pm including a main light-emitting element ED, and a main thin-film transistor TFT connected to the main sub-pixel Pm may be arranged in the main display area MDA of the display panel 10, and an auxiliary sub-pixel Pa including an auxiliary light-emitting element ED', and an auxiliary thin-film transistor TFT' connected to the auxiliary sub-pixel Pa may be arranged in the component area CA.

In addition, a transmission area TA, in which a display element is not arranged, may be arranged in the component area CA. The transmission area TA may be an area through which light/signal emitted from the component 40 arranged to correspond to the component area CA or light/signal incident on the component 40 is transmitted.

A bottom metal layer BML may be arranged in the component area CA. The bottom metal layer BML may be arranged to correspond to a lower portion of the auxiliary thin-film transistor TFT'. For example, the bottom metal layer BML may be between the auxiliary thin-film transistor TFT' and the substrate 100. The bottom metal layer BML may block external light from reaching the auxiliary thin-film transistor TFT'. In some embodiments, a constant voltage or a signal may be applied to the bottom metal layer BML.

The display element layer EDL may be covered by the thin-film encapsulation layer TFEL or the sealing substrate. In some embodiments, the thin-film encapsulation layer TFEL may include at least one inorganic encapsulation layer and at least one organic encapsulation layer. In an embodiment, the thin-film encapsulation layer TFEL may include a first inorganic encapsulation layer 161, a second inorganic encapsulation layer 163, and an organic encapsulation layer 162 therebetween.

When the display element layer EDL is sealed by the sealing substrate (not shown), the sealing substrate may be arranged to face the substrate 100 with the display element layer EDL therebetween. There may be a gap between the sealing substrate and the display element layer EDL. The sealing substrate may include glass. A sealant formed of frit may be between the substrate 100 and the sealing substrate, and the sealant may be arranged in the aforementioned peripheral area DPA. The sealant arranged in the peripheral area DPA may surround the display area DA and prevent moisture from penetrating through side surfaces of the display panel 10.

The touchscreen layer TSL may obtain coordinate information according to an external input, for example, a touch event. The touchscreen layer TSL may include a touch electrode and wires connected to the touch electrode. The touchscreen layer TSL may sense an external input by using a self-capacitance method or a mutual capacitance method.

The touchscreen layer TSL may be formed on the thin-film encapsulation layer TFEL. Alternatively, the touchscreen layer TSL may be separately formed on a touch substrate and then coupled onto the thin-film encapsulation layer TFEL through an adhesive layer such as an optical clear adhesive (OCA). In an embodiment, the touchscreen layer TSL may be directly formed on the thin-film encapsulation layer TFEL, and in this case, the adhesive layer may not be between the touchscreen layer TSL and the thin-film encapsulation layer TFEL.

The optical functional layer OFL may include a reflection prevention layer. The reflection prevention layer may reduce the reflectivity of light (external light) that is incident to the display device 1.

In some embodiments, the optical functional layer OFL may include a polarizing film. The optical functional layer OFL may include an opening OFL_OP corresponding to the transmission area TA. Accordingly, light transmittance in the transmission area TA may be significantly improved. The opening OFL_OP may be filled with a transparent material such as an optically clear resin (OCR).

In some embodiments, as shown in FIG. 4, the optical functional layer OFL may be provided as a filter plate 180 including a black matrix and color filters. The filter plate 180 may include a color filter 182, a black matrix 183, and an overcoat layer 184. The color filter 182 may be arranged considering colors of light respectively emitted from pixels of the display panel 10. For example, the color filter 182 may be red, green, or blue according to colors of light emitted from the light-emitting elements ED and ED'. The color filter 182 and the black matrix 183 may not be in the transmission area TA. For example, a layer including the color filter 182 and the black matrix 183 may include a hole 183OP corresponding to the transmission area TA, and the hole 183OP may be at least partially filled with the overcoat layer 184. The overcoat layer 184 may include an organic material such as a resin, and the aforementioned organic material may be transparent.

A display device including the optical functional layer OFL that includes the color filter 182 and the black matrix 183 may have a greatly reduced thickness compared to a display device including a polarizing plate.

The cover window (not shown) may be arranged on the display panel 10 to thereby protect the display panel 10. The optical functional layer OFL may be attached to the cover window with an OCA or may be attached to the touchscreen layer TSL with an OCA.

The panel protection member PB may be attached to a lower portion of the substrate 100 to thereby support and protect the substrate 100. The panel protection member PB may include an opening PB_OP corresponding to the component area CA. Because the panel protection member PB includes the opening PB_OP, light transmittance in the component area CA may be improved. The panel protection member PB may include polyethylene terepthalate (PET) or polyimide (PI).

An area of the component area CA may be greater than an area in which the component 40 is arranged. Accordingly, an area of the opening PB_OP provided in the panel protection member PB may not correspond to the area of the component area CA.

Figure 5:
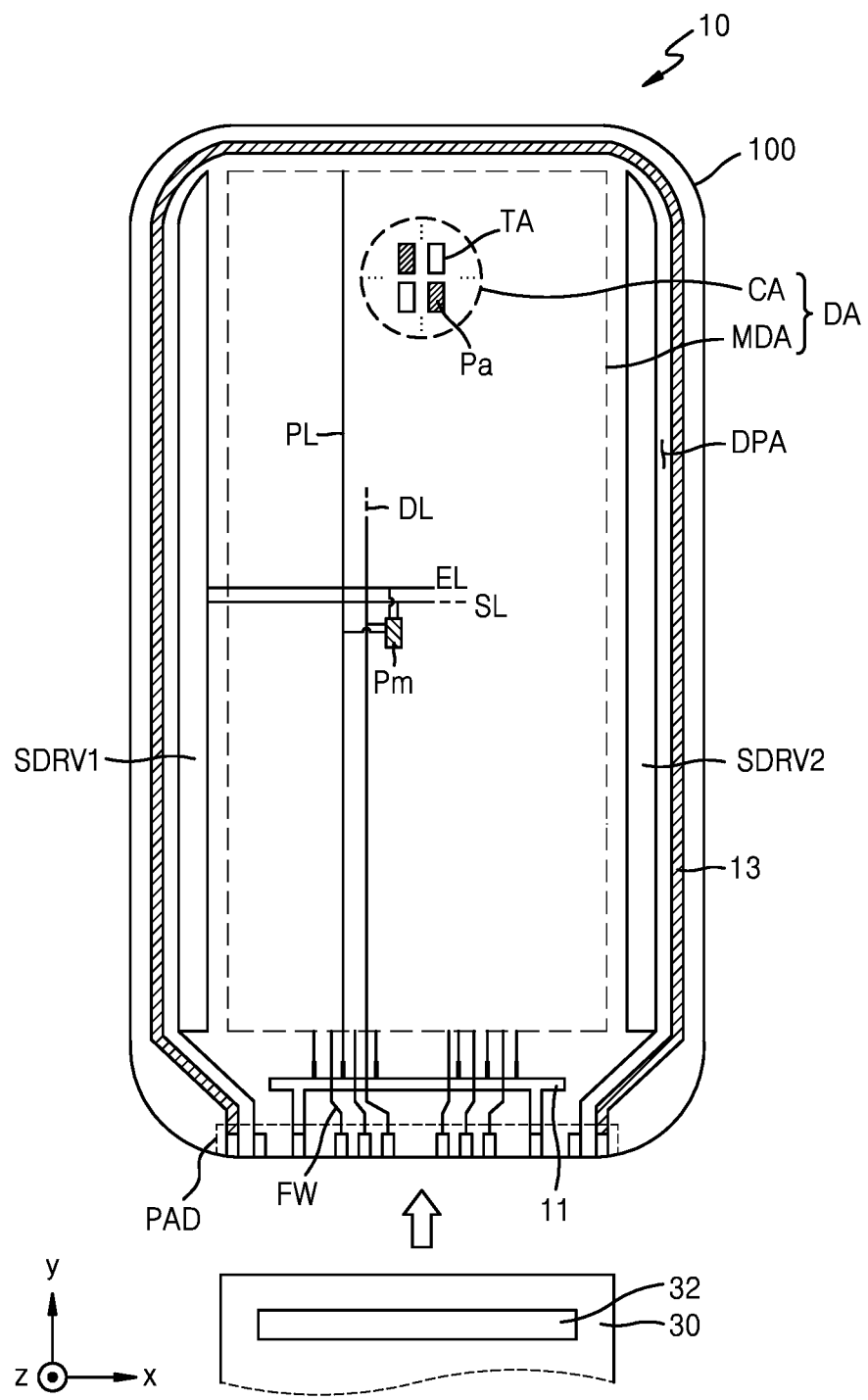
FIG. 5 is a schematic plan view of a display panel according to an exemplary embodiment of the invention.

FIG. 5 is a schematic plan view of a display panel 10 according to an embodiment.

Referring to FIG. 5, various elements constituting the display panel 10 may be arranged on the substrate 100. The substrate 100 includes a display area DA and a peripheral area DPA surrounding the display area DA. The display area DA includes a main display area MDA on which a main image is displayed, and a component area CA on which an auxiliary image is displayed, the component area CA including a transmission area TA. The auxiliary image may form one whole image together with the main image or may be an image independent from the main image.

A plurality of main sub-pixels Pm are arranged in the main display area MDA. The main sub-pixels Pm each may be implemented by a display element such as an organic light-emitting diode (OLED). Each of the main sub-pixels Pm may emit, for example, red, green, blue, or white light. The main display area MDA may be covered by the encapsulation member and thus protected from external air or moisture.

As described above, the component area CA may be on one side of the main display area MDA or may be arranged inside the display area DA and surrounded by the main display area MDA. A plurality of auxiliary sub-pixels Pa are arranged in the component area CA. The auxiliary sub-pixels Pa each may be implemented by a display element such as an OLED. Each of the auxiliary sub-pixels Pa may emit, for example, red, green, blue, or white light. The component area CA may be covered by the encapsulation member and thus protected from external air or moisture.

The component area CA may have a transmission area TA. The transmission area TA may be arranged to surround the auxiliary sub-pixels Pa. Alternatively, the transmission area TA may be arranged in a lattice form with the auxiliary sub-pixels Pa.

The component area CA includes the transmission area TA, and thus, the resolution of the component area CA may be lower than the resolution of the main display area MDA. For example, the resolution of the component area CA may be about ½, ⅜, ⅓ ¼, 2/9, ⅛, 1/9, or 1/16 of the resolution of the main display area MDA. For example, the resolution of the main display area MDA may be about 400 ppi or higher, and the resolution of the component area CA may be about 200 ppi or about 100 ppi.

Pixel circuits that drive the main and auxiliary sub-pixels Pm and Pa may be electrically connected to outer circuits arranged in the peripheral area DPA, respectively. A first scan driving circuit SDRV1, a second scan driving circuit SDRV2, a terminal portion PAD, a driving voltage supply line 11, and a common voltage supply line 13 may be arranged in the peripheral area DPA.

The first scan driving circuit SDRV1 may be configured to apply, through a scan line SL, a scan signal to each of the pixel circuits that drive the main and auxiliary sub-pixels Pm and Pa. The first scan driving circuit SDRV1 may be configured to apply an emission control signal to each of the pixel circuits through an emission control line EL. The second scan driving circuit SDRV2 may be located on the opposite side of the first scan driving circuit SDRV1 with respect to the main display area MDA and may be substantially parallel to the first scan driving circuit SDRV1. Some of pixel circuits of the main sub-pixels Pm in the main display area MDA may be electrically connected to the first scan driving circuit SDRV1, and the remaining pixel circuits may be electrically connected to the second scan driving circuit SDRV2. Some of pixel circuits of the auxiliary sub-pixels Pa in the component area CA may be electrically connected to the first scan driving circuit SDRV1, and the remaining pixel circuits may be electrically connected to the second scan driving circuit SDRV2. The second scan driving circuit SDRV2 may be omitted.

The terminal portion PAD may be arranged on one side of the substrate 100. The terminal portion PAD is exposed by not being covered by an insulating layer and is connected to a display circuit board 30. A display driver 32 may be arranged on the display circuit board 30.

The display driver 32 may be configured to generate a control signal that is transmitted to the first scan driving circuit SDRV1 and the second scan driving circuit SDRV2. The display driver 32 may be configured to generate a data signal, and the generated data signal may be transmitted to the pixel circuits of the main and auxiliary sub-pixels Pm and Pa through a fan-out wire FW and a data line DL connected to the fan-out wire FW.

The display driver 32 may be configured to supply a driving voltage ELVDD to the driving voltage supply line 11 and may be configured to supply a common voltage ELVSS to the common voltage supply line 13. The driving voltage ELVDD may be applied to the pixel circuits of the main and auxiliary sub-pixels Pm and Pa through a driving voltage line PL connected to the driving voltage supply line 11, and the common voltage ELVSS may be applied to an opposite electrode of a display element through the common voltage supply line 13.

The driving voltage supply line 11 may be connected to the terminal portion PAD and may extend in an x-direction from below the main display area MDA. The common voltage supply line 13 may be connected to the terminal portion PAD, and may have a shape in which one side is open in a loop shape and thus partially surround the main display area MDA.

Figure 6A:
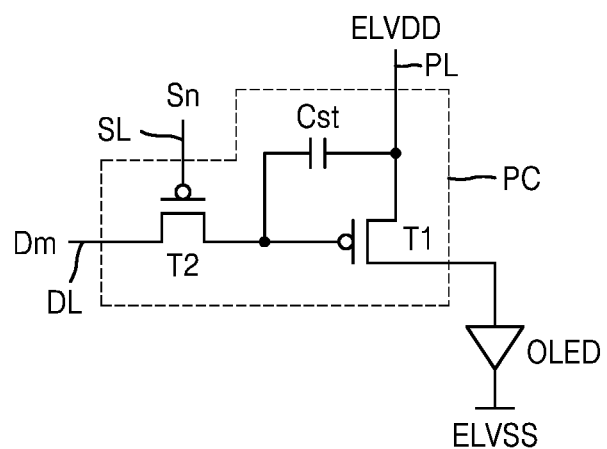
FIGS. 6A and 6B are equivalent circuit diagrams of a pixel circuit that drives a main sub-pixel and an auxiliary sub-pixel, according to exemplary embodiments of the invention.
Figure 6B:
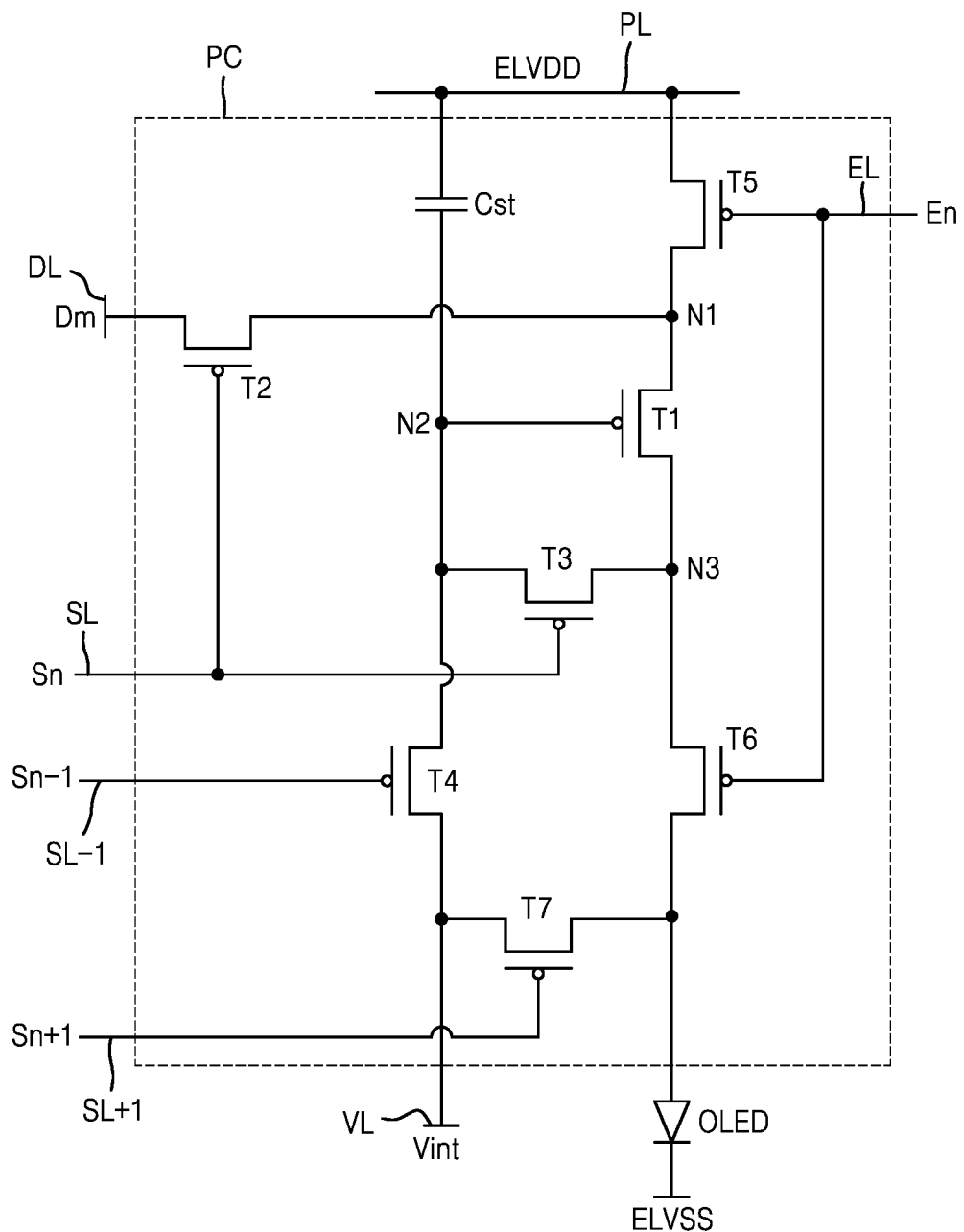

FIGS. 6A and 6B are equivalent circuit diagrams of a pixel circuit PC that drives a main sub-pixel Pm and an auxiliary sub-pixel Pa, according to embodiments.

Referring to FIG. 6A, the pixel circuit PC may be connected to a light-emitting element to implement light emission of sub-pixels. The light-emitting element may be an OLED. The pixel circuit PC may include a driving transistor T1, a switching transistor T2, and a capacitor Cst. The switching transistor T2 may be connected to a scan line SL and a data line DL and may be configured to transmit, to the driving transistor T1, a data signal Dm input through the data line DL, according to a scan signal Sn input through the scan line SL.

The capacitor Cst may be connected to the switching transistor T2 and a driving voltage line PL and may be configured to store a voltage corresponding to a difference between a voltage received from the switching transistor T2 and a driving voltage ELVDD supplied to the driving voltage line PL.

The driving transistor T1 may be connected to the driving voltage line PL and the capacitor Cst and may be configured to control a driving current flowing from the driving voltage line PL to a organic light-emitting diode OLED in response to a value of the voltage stored in the capacitor Cst. The organic light-emitting diode OLED may emit light having a certain luminance according to the driving current.

In FIG. 6A, a case where the pixel circuit PC includes two thin-film transistors and one storage capacitor has been described, but the embodiment is not limited thereto.

Referring to 6B, the pixel circuit PC may include first to seventh transistors T1, T2, T3, T4, T5, T6, and T7, and depending on types (p-type or n-type) and/or operation conditions of transistors, each of the first to seventh transistors T1 to T7 may include a first terminal which is a source terminal or a drain terminal, and a second terminal which is a terminal different from the first terminal. For example, when the first terminal is a source terminal, the second terminal may be a drain terminal.

The pixel circuit PC may be connected to a first scan line SL configured to transmit a first scan signal Sn, a second scan line SL−1 configured to transmit a second scan signal Sn−1, a third scan line SL+1 configured to transmit a third scan signal Sn+1, an emission control line EL configured to transmit an emission control signal En, a data line DL configured to transmit a data signal Dm, a driving voltage line PL configured to transmit a driving voltage ELVDD, and an initialization voltage line VL configured to transmit an initialization voltage Vint.

The first transistor T1 includes a gate terminal connected to a second node N2, a first terminal connected to a first node N1, and a second terminal connected to a third node N3. The first transistor T1 functions as the driving transistor and is configured to supply the driving current to the light-emitting element by receiving the data signal Dm, according to the switching operation of the second transistor T2. The light-emitting element may be an OLED.

The second transistor T2 (the switching transistor) includes a gate terminal connected to the first scan line SL, a first terminal connected to the data line DL, and a second terminal connected to the first node N1 (or the first terminal of the first transistor T1). The second transistor T2 may be turned on in response to the first scan signal Sn transmitted through the first scan line SL and may perform a switching operation of transmitting, to the first node N1, the data signal Dm transmitted to the data line DL.

The third transistor T3 (a compensation transistor) includes a gate terminal connected to the first scan line SL, a first terminal connected to the second node N2 (or the gate terminal of the first transistor T1), and a second terminal connected to the third node N3 (or the second terminal of the first transistor T1). The third transistor T3 may be turned on in response to the first scan signal Sn transmitted through the first scan line SL, thereby causing the first transistor T1 to be diode-connected. The third transistor T3 may have a structure in which at least two transistors are connected in series.

The fourth transistor T4 (first initialization transistor) includes a gate terminal connected to the second scan line SL−1, a first terminal connected to the initialization voltage line VL, and a second terminal connected to the second node N2. The fourth transistor T4 may be turned on in response to the second scan signal Sn−1 transmitted through the second scan line SL−1 and may transmit the initialization voltage Vint to the gate terminal of the first transistor T1, thereby initializing a gate voltage of the first transistor T1. The fourth transistor T4 may have a structure in which at least two transistors are connected in series.

The fifth transistor T5 (or a first emission control transistor) includes a gate terminal connected to the emission control line EL, a first terminal connected to the driving voltage line PL, and a second terminal connected to the first node N1. The sixth transistor T6 (a second emission control transistor) includes a gate terminal connected to the emission control line EL, a first terminal connected to the third node N3, and a second terminal connected to a pixel electrode of the organic light-emitting diode OLED. The fifth and sixth transistors T5 and T6 are simultaneously turned on in response to the emission control signal En transmitted through the emission control line EL, and thus, a current flows in the organic light-emitting diode OLED.

The seventh transistor T7 (a second initialization transistor) includes a gate terminal connected to the third scan line SL+1, a first terminal connected to the second terminal of the sixth transistor T6 and the pixel electrode of the organic light-emitting diode OLED, and a second terminal connected to the initialization voltage line VL. The seventh transistor T7 may be turned on in response to the third scan signal Sn+1 transmitted through the third scan line SL+1 and may initialize a voltage of the pixel electrode of the organic light-emitting diode OLED by transmitting the initialization voltage Vint to the pixel electrode of the organic light-emitting diode OLED. The seventh transistor T7 may be omitted.

The capacitor Cst includes a first electrode connected to the second node N2 and a second electrode connected to the driving voltage line PL.

The organic light-emitting diode OLED may include the pixel electrode and a common electrode facing the pixel electrode, and the common electrode may receive the common voltage ELVSS. The organic light-emitting diode OLED emits light having a certain color after receiving the driving current from the first transistor T1, and thus, an image may be displayed. The common electrode may be provided in common with a plurality of sub-pixels, that is, integrally.

In FIG. 6B, it is shown that the fourth transistor T4 and the seventh transistor T7 are respectively connected to the second scan line SL−1 and the third scan line SL+1, but the embodiment is not limited thereto. In another embodiment, both the fourth transistor T4 and the seventh transistor T7 may be connected to the second scan line SL−1 and driven according to the second scan signal Sn−1.

The pixel circuits PC that drive the main sub-pixel Pm and the auxiliary sub-pixel Pa may be the same as or different from each other. For example, the pixel circuits PC that drive the main sub-pixel Pm and the auxiliary sub-pixel Pa may be provided as the pixel circuit PC shown in FIG. 6B. In another embodiment, for the pixel circuit PC that drives the main sub-pixel Pm, the pixel circuit PC shown in FIG. 6B may be used, and for the pixel circuit PC that drives the auxiliary sub-pixel Pa, the pixel circuit PC shown in FIG. 6A may be used.

In FIGS. 6A and 6B, it is shown that the transistors of the pixel circuit PC are p-type transistors, but the embodiment is not limited thereto. For example, the transistors of the pixel circuit PC may be N-type transistors, or some of the transistors may be P-type transistors, and the others may be N-type transistors. Various embodiments are possible.

Figure 7:
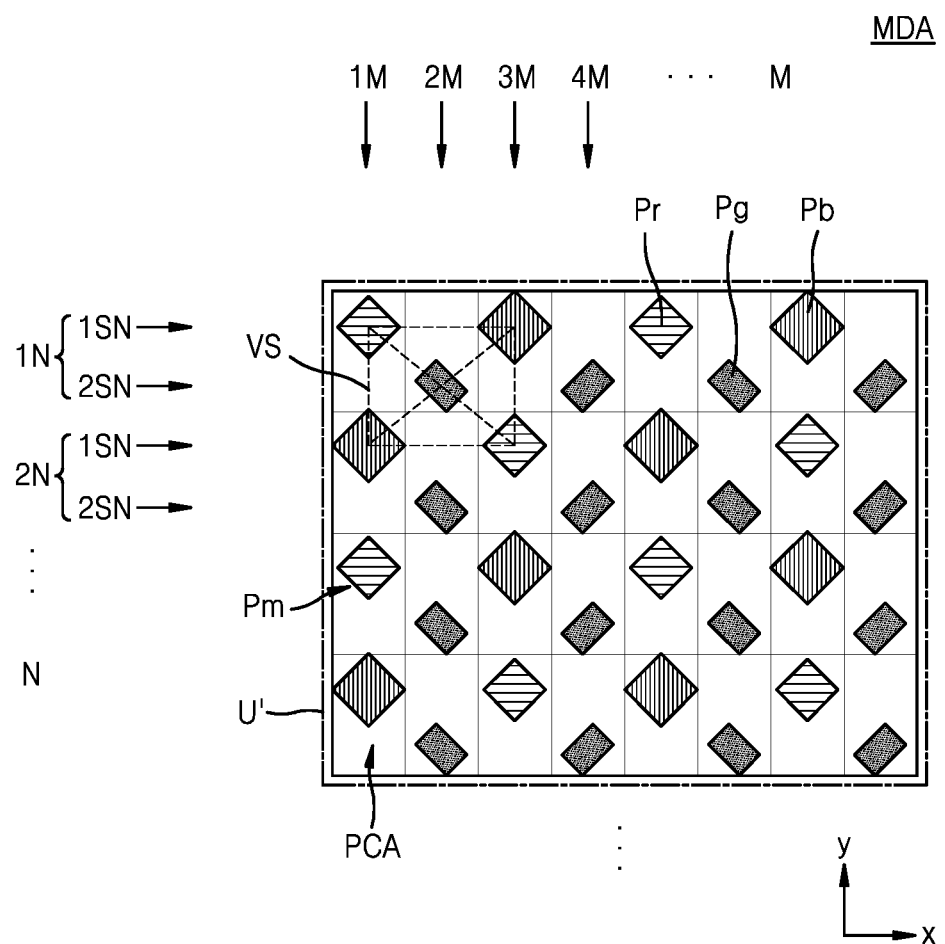
FIG. 7 is a schematic layout view of a pixel arrangement structure in a main display area, according to an exemplary embodiment of the invention.

FIG. 7 is a schematic layout view of a pixel arrangement structure in a main display area MDA, according to an embodiment.

Referring to FIG. 7, a plurality of main sub-pixels Pm may be arranged in the main display area MDA. In the present specification, a sub-pixel refers to an emission area as a minimum unit for implementing an image. When an OLED is used as a display element, the emission area of the OLED may be defined by an opening of an emission layer or a pixel-defining layer. This will be described later.

Each area divided by a solid line in the main display area MDA of FIG. 7 is a pixel circuit area PCA in which a pixel circuit connected to a main sub-pixel Pm is arranged.

The main sub-pixels Pm may include a red sub-pixel Pr, a green sub-pixel Pg, and a blue sub-pixel Pb, and the red sub-pixel Pr, the green sub-pixel Pg, and the blue sub-pixel Pb may implement red, green, and blue, respectively.

The red sub-pixel Pr and the blue sub-pixel Pb are alternately arranged in a first sub-row 1SN of each row N, and the green sub-pixel Pg is arranged at a certain interval in an adjacent second sub-row 2SN. This arrangement of pixels may be repeated up to an Nth row. In this case, the blue sub-pixel Pb and the red sub-pixel Pr may be provided greater than the green sub-pixel Pg. The red sub-pixel Pr and the blue sub-pixel Pb arranged in the first sub-row 1SN and the green sub-pixel Pg arranged in the second sub-row 2SN may be arranged to be offset. Accordingly, a red sub-pixel Pr and a blue sub-pixel Pb are alternately arranged in a first column 1M, a green sub-pixel Pg is arranged at a certain interval in an adjacent second column 2M, a blue sub-pixel Pb and a red sub-pixel Pr are alternately arranged in an adjacent third column 3M, and a green sub-pixel Pg is arranged at a certain interval in an adjacent fourth column 4M. This arrangement of pixels may be repeated up to an Mth column.

When such a pixel arrangement structure is differently expressed, in a virtual rectangle VS having a center of a green sub-pixel Pg as its center, red sub-pixels Pr are arranged at first and third vertices facing each other among vertices of the virtual rectangle VS, and blue sub-pixels Pb are arranged at second and fourth vertices, which are the remaining vertices. In this case, the virtual rectangle VS may be variously modified, such as a rectangle, a rhombus, a square, etc.

This pixel arrangement structure is called a pentile matrix structure or a pentile structure, and by applying a rendering driving method that expresses colors by sharing adjacent pixels, high resolution may be realized with a small number of pixels.

In FIG. 7, it is shown that the main sub-pixels Pm are arranged in a pentile structure, but the embodiment is not limited thereto. For example, the main sub-pixels Pm may be arranged in various shapes, such as a stripe structure, a mosaic arrangement structure, a delta arrangement structure, etc.

Figure 8A:
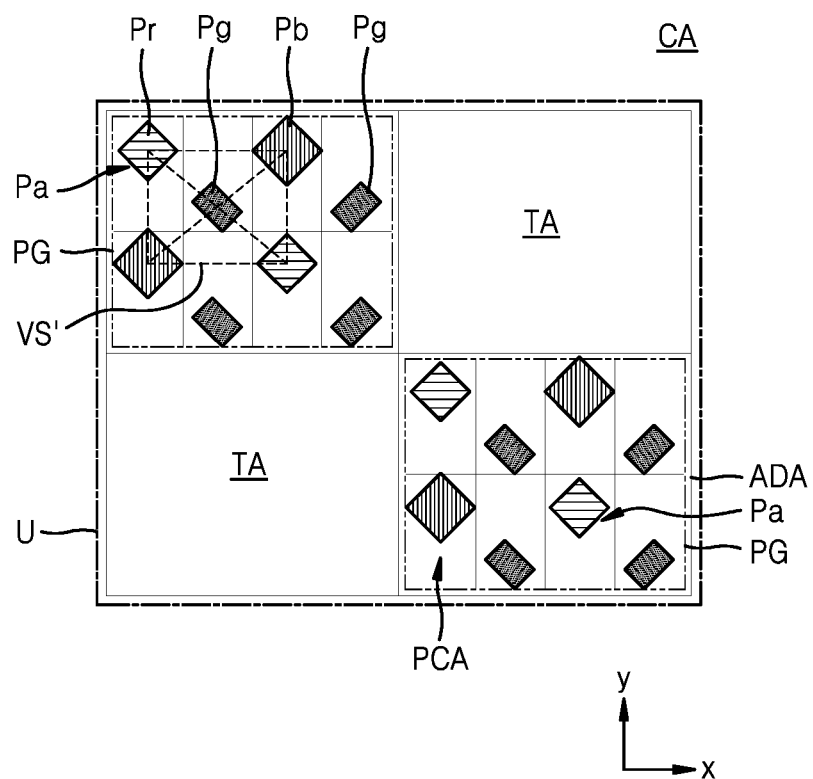
FIGS. 8A and 8B are schematic layout views of a pixel arrangement structure in a component area, according to exemplary embodiments of the invention.
Figure 8B:
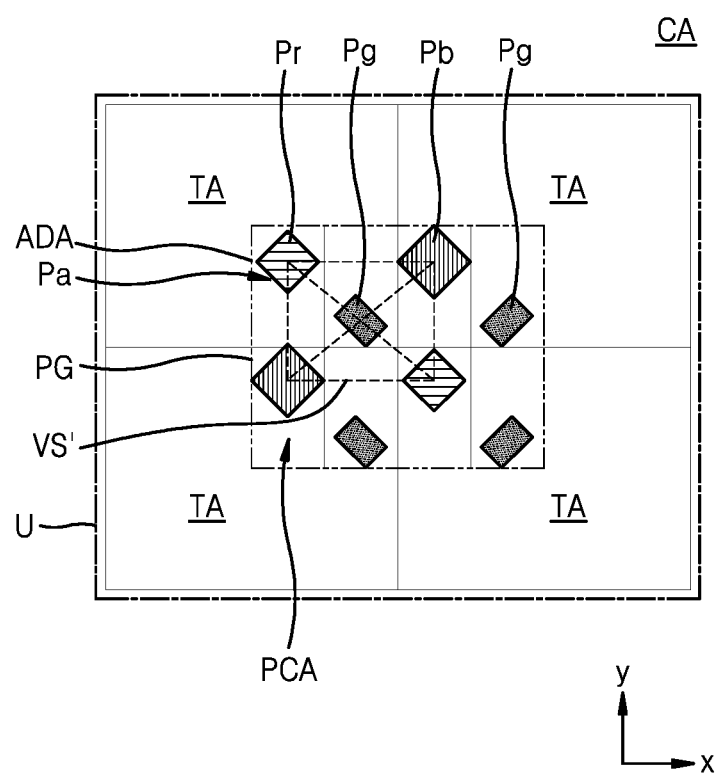

FIGS. 8A and 8B are schematic layout views of a pixel arrangement structure in a component area CA, according to embodiments.

Referring to FIG. 8A, a plurality of auxiliary sub-pixels Pa may be arranged in the component area CA. Each of the auxiliary sub-pixels Pa may emit any one of red, green, blue, and white light.

The component area CA may have a sub-pixel area ADA and a transmission area TA. The sub-pixel area ADA may be an area in which auxiliary sub-pixels Pa are arranged. A pixel group PG including at least one auxiliary sub-pixel Pa may be arranged in the sub-pixel area ADA. The sub-pixel area ADA and the transmission area TA may be alternately arranged in an x-direction and a y-direction, and may be arranged in a lattice shape, for example. In this case, the component area CA may have a plurality of sub-pixel areas ADA and a plurality of transmission areas TA.

Each area divided by a solid line in the sub-pixel area ADA of FIG. 8A is a pixel circuit area PCA in which a pixel circuit connected to an auxiliary sub-pixel Pa is arranged.

The pixel group PG may be defined as a collection (or set) of sub-pixels in which a plurality of auxiliary sub-pixels Pa are grouped in a preset unit. For example, as shown in FIG. 8A, one pixel group PG may include eight auxiliary sub-pixels Pa arranged in a pentile structure. That is, one pixel group PG may include two red sub-pixels Pr, four green sub-pixels Pg, and two blue sub-pixels Pb.

In the component area CA, a basic unit U in which a certain number of pixel groups PG and a certain number of transmission areas TA are bound to each other may be repeatedly arranged in the x-direction and the y-direction. In FIG. 8A, the basic unit U may have a shape in which two pixel groups PG and two transmission areas TA arranged therearound are bound to each other in a square shape. In the basic unit U, areas of repeated shapes are divided, but it does not mean disconnection between elements.

As shown in FIG. 7, a corresponding unit U' having an area equal to an area of the basic unit U may be set in the main display area MDA. In this case, the number of main sub-pixels Pm included in the corresponding unit U' may be greater than the number of auxiliary sub-pixels Pa included in the basic unit U. That is, there are 16 auxiliary sub-pixels Pa included in the basic unit U and 32 main sub-pixels Pm included in the corresponding unit U', and the number of auxiliary sub-pixels Pa and the number of main sub-pixels Pm arranged per the same area may be provided at a ratio of 1:2.

Similar to the arrangement of main sub-pixels Pm in the main display area MDA, four auxiliary sub-pixels Pa may be arranged at vertices of a virtual rectangle VS', respectively. The resolution of the component area CA is ½ of the resolution of the main display area MDA, and the pixel arrangement structure of the component area CA is called a ½ pentile structure. The number and arrangement of auxiliary sub-pixels Pa included in the pixel group PG may be modified according to the resolution of the component area CA.

Referring to FIG. 8B, the pixel arrangement structure of the component area CA may be provided in a ¼ pentile structure. In the present embodiment, eight auxiliary sub-pixels Pa are arranged in the pixel group PG in a pentile structure, and only one pixel group PG may be included in the basic unit U. The remaining area of the basic unit U may be provided as the transmission areas TA. Accordingly, the number of auxiliary sub-pixels Pa and the number of main sub-pixels Pm arranged per the same area may be provided at a ratio of 1:4. In this case, one pixel group PG may be surrounded by the transmission areas TA.

In FIGS. 8A and 8B, it is shown that the auxiliary sub-pixels Pa are arranged in a pentile structure, but the embodiment is not limited thereto. For example, the auxiliary sub-pixels Pa may be arranged in various shapes, such as a stripe structure, a mosaic arrangement structure, a delta arrangement structure, etc.

In addition, in FIGS. 8A and 8B, it is shown that a size of the auxiliary sub-pixel Pa is equal to a size of the main sub-pixel Pm, but the embodiment is not limited thereto. The size of the auxiliary sub-pixel Pa may be greater than a size of a main sub-pixel Pm that emits the same color as the auxiliary sub-pixel Pa. For example, a size of a blue sub-pixel Pb of the auxiliary sub-pixel Pa may be greater than a size of a blue sub-pixel Pb of the main sub-pixel Pm. A difference in the size may be designed considering a difference in the luminance and/or resolution between the component area CA and the main display area MDA.

Figure 9:
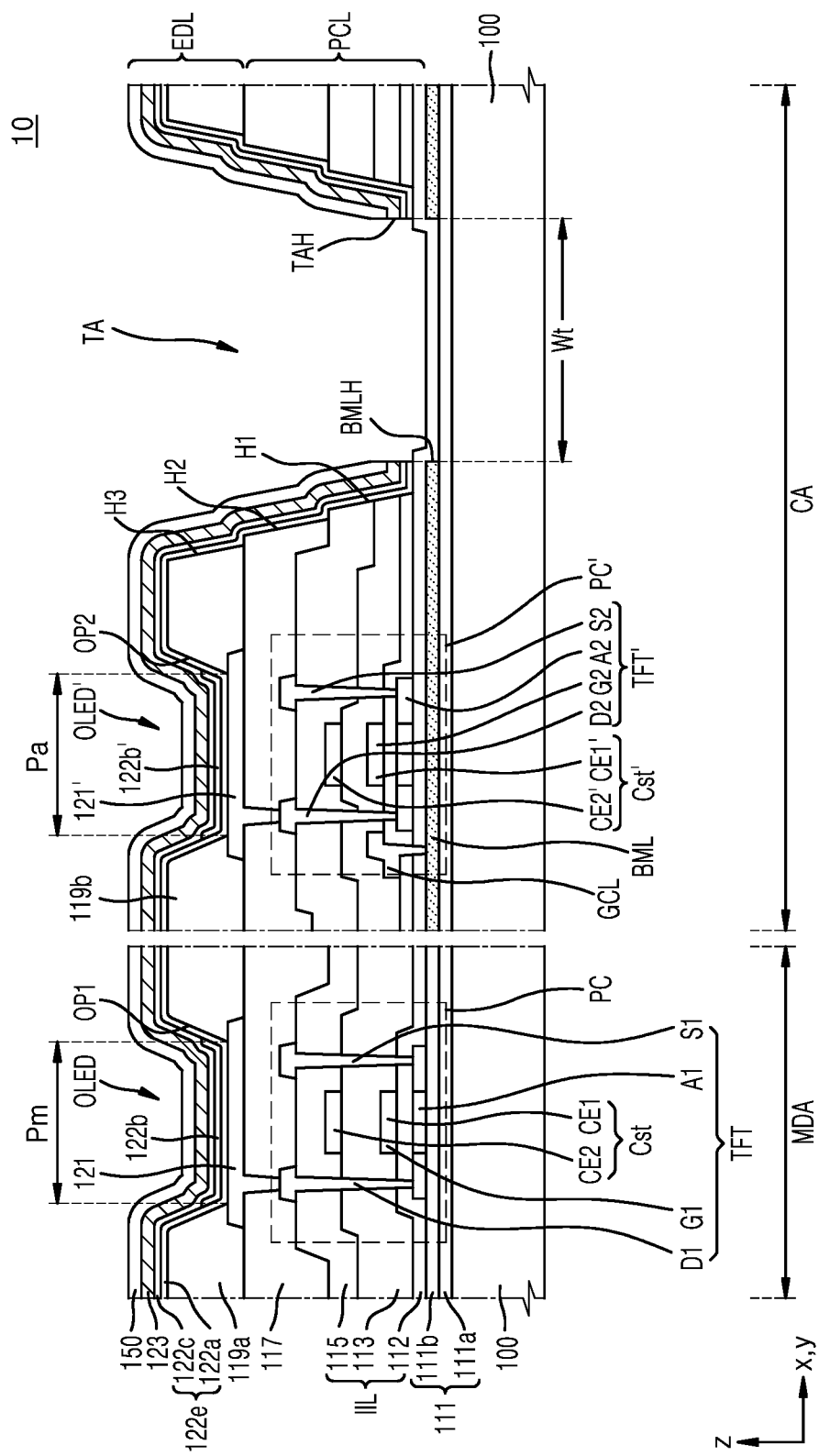
FIG. 9 is a schematic cross-sectional view of a portion of a display panel according to an embodiment, which is a schematic cross-sectional view of a main display area and a component area.

FIG. 9 is a schematic cross-sectional view of a portion of a display panel 10 according to an embodiment, which is a schematic cross-sectional view of a main display area MDA and a component area CA.

Referring to FIG. 9, the display panel 10 may include the main display area MDA and the component area CA. A main sub-pixel Pm is arranged in the main display area MDA, and an auxiliary sub-pixel Pa and a transmission area TA are arranged in the component area CA. A main pixel circuit PC and a main organic light-emitting diode OLED, which is a display element connected to the main pixel circuit PC, may be arranged in the main display area MDA, the main pixel circuit PC including a main thin-film transistor TFT and a main capacitor Cst. An auxiliary pixel circuit PC' and an auxiliary organic light-emitting diode OLED', which is a display element connected to the auxiliary pixel circuit PC', may be arranged in the component area CA, the auxiliary pixel circuit PC' including an auxiliary thin-film transistor TFT' and an auxiliary capacitor Cst'.

In the present embodiment, an OLED is used as a display element, as an example, but in another embodiment, an inorganic light-emitting element or a quantum dot light-emitting element may be used as a display element.

Hereinbelow, a structure in which elements included in the display panel 10 are stacked will be described. The display panel 10 may be provided by stacking a substrate 100, a buffer layer 111, a circuit layer PCL, and a display element layer EDL. As shown in FIG. 3, an encapsulation member ENCM and an optical functional layer OFL may be further stacked on the display element layer EDL.

The substrate 100 may include an insulating material such as glass, quartz, or a polymer resin. The substrate 100 may be a rigid substrate or a flexible substrate that is bendable, foldable, or rollable.

The buffer layer 111 may be on the substrate 100 to thereby reduce or block penetration of foreign matter, moisture, or external air from below the substrate 100 and provide a flat surface on the substrate 100. The buffer layer 111 may include an inorganic material such as an oxide or nitride, an organic material, or an organic-inorganic composite, and may have a single-layered or multi-layered structure of an inorganic material and an organic material. A barrier layer (not shown) that blocks penetration of external air may be further between the substrate 100 and the buffer layer 111. In some embodiments, the buffer layer 111 may include silicon oxide (SiO$_x$), silicon nitride (SiN$_x$), or silicon oxynitride (SiO$_x$N$_y$). The buffer layer 111 may have a structure in which a first buffer layer 111a and a second buffer layer 111b are stacked.

In the component area CA, the bottom metal layer BML may be between the first buffer layer 111a and the second buffer layer 111b. In another embodiment, the bottom metal layer BML may be between the substrate 100 and the first buffer layer 111a. The bottom metal layer BML may be under the auxiliary pixel circuit PC' to thereby prevent characteristics of the auxiliary thin-film transistor TFT' from being deteriorated due to light emitted from a component or the like. In addition, the bottom metal layer BML may prevent light emitted from the component or the like or traveling toward the component from being diffracted through a narrow gap between wires connected to the auxiliary pixel circuit PC'. The bottom metal layer BML may not be in the transmission area TA.

In addition, the bottom metal layer BML may be connected to a wire GCL, arranged on a different layer, through a contact hole. The bottom metal layer BML may receive a constant voltage or a signal from the wire GCL. For example, the bottom metal layer BML may receive a bias voltage.

The bottom metal layer BML may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and/or doped silicon (doped-Si). The bottom metal layer BML may include a single layer or a multi-layer of the aforementioned material.

The circuit layer PCL may be arranged on the buffer layer 111 and may include main and auxiliary pixel circuits PC and PC', a first gate insulating layer 112, a second gate insulating layer 113, an interlayer insulating layer 115, and a planarization layer 117.

The main thin-film transistor TFT and the auxiliary thin-film transistor TFT' may be arranged on the buffer layer 111. The main thin-film transistor TFT may include a first semiconductor layer A1, a first gate electrode G1, a first source electrode S1, and a first drain electrode D1. The auxiliary thin-film transistor TFT' may include a second semiconductor layer A2, a second gate electrode G2, a second source electrode S2, and a second drain electrode D2. The main thin-film transistor TFT may be connected to the main organic light-emitting diode OLED to drive the main organic light-emitting diode OLED. The auxiliary thin-film transistor TFT' may be connected to the auxiliary organic light-emitting diode OLED' to drive the auxiliary organic light-emitting diode OLED'.

The first semiconductor layer A1 and the second semiconductor layer A2 may be arranged on the buffer layer 111 and may include polysilicon. In another embodiment, the first semiconductor layer A1 and the second semiconductor layer A2 may include amorphous silicon. In another embodiment, the first semiconductor layer A1 and the second semiconductor layer A2 each may include an oxide of at least one material selected from the group consisting of indium (In), gallium (Ga), stannium (Sn), zirconium (Zr), vanadium (V), hafnium (Hf), cadmium (Cd), germanium (Ge), Cr, Ti, and zinc (Zn). The first semiconductor layer A1 and the second semiconductor layer A2 each may include a channel region and a source region doped with impurities.

The second semiconductor layer A2 may overlap the bottom metal layer BML with the second buffer layer 111b therebetween. In an embodiment, a width of the second semiconductor layer A2 may be less than a width of the bottom metal layer BML, and thus, when projected in a direction perpendicular to the substrate 100, the second semiconductor layer A2 may entirely overlap the bottom metal layer BML.

The first gate insulating layer 112 may be provided to cover the first semiconductor layer A1 and the second semiconductor layer A2. The first gate insulating layer 112 may include an inorganic insulating material such as SiO$_x$, SiN$_x$, silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$). The first gate insulating layer 112 may include a single layer or multi-layer including the aforementioned inorganic insulating material.

The first gate electrode G1 and the second gate electrode G2 are arranged on the first gate insulating layer 112 to overlap the first semiconductor layer A1 and the second semiconductor layer A2, respectively. The first gate electrode G1 and the second gate electrode G2 each may include Mo, Al, Cu, Ti, etc. and may include a single layer or multi-layer. As an example, the first gate electrode G1 and the second gate electrode G2 each may include a single Mo layer.

The second gate insulating layer 113 may be provided to cover the first gate electrode G1 and the second gate electrode G2. The second gate insulating layer 113 may include an inorganic insulating material such as SiO$_x$, SiN$_x$, SiON, Al$_2$O$_3$, TiO$_2$, Ta$_2$O$_5$, HfO$_2$, or ZnO$_2$. The second gate insulating layer 113 may include a single layer or multi-layer including the aforementioned inorganic insulating material.

A first upper electrode CE2 of the main capacitor Cst and a second upper electrode CE2' of the auxiliary capacitor Cst' may be arranged on the second gate insulating layer 113.

In the main display area MDA, the first upper electrode CE2 may overlap the first gate electrode G1 thereunder. The first gate electrode G1 and the first upper electrode CE2, which overlap each other with the second gate insulating layer 113 therebetween, may form the main capacitor Cst. The first gate electrode G1 may be a first lower electrode CE1 of the main capacitor Cst.

In the component area CA, the second upper electrode CE2' may overlap the second gate electrode G2 thereunder. The second gate electrode G2 and the second upper electrode CE2', which overlap each other with the second gate insulating layer 113 therebetween, may form the auxiliary capacitor Cst'. The second gate electrode G2 may be a lower electrode CE1' of the auxiliary capacitor Cst'.

The first upper electrode CE2 and the second upper electrode CE2' each may include Al, Pt, Pd, Ag, Mg, Au, Ni, Nd, Ir, Cr, Ca, Mo, Ti, W, and/or Cu, and may include a single layer or multi-layer of the aforementioned material.

The interlayer insulating layer 115 may be formed to cover the first upper electrode CE2 and the second upper electrode CE2'. The interlayer insulating layer 115 may include SiO$_x$, SiN$_x$, SiON, Al$_2$O$_3$, TiO$_2$, Ta$_2$O$_5$, HfO$_2$, or ZnO$_2$. The interlayer insulating layer 115 may include a single layer or multi-layer including the aforementioned inorganic insulating material.

When the first gate insulating layer 112, the second gate insulating layer 113, and the interlayer insulating layer 115, are collectively referred to as an inorganic insulating layer IIL, the inorganic insulating layer IIL may include a first hole H1 corresponding to the transmission area TA. The first hole H1 may expose a portion of an upper surface of the buffer layer 111 or the substrate 100. The first hole H1 may overlap an opening of the first gate insulating layer 112, an opening of the second gate insulating layer 113, and an opening of the interlayer insulating layer 115, which are formed to correspond to the transmission area TA. The openings may be individually formed through separate processes or simultaneously formed through the same process. When the openings are formed through separate processes, an inner surface of the first hole H1 may not be smooth and may have a stair-like step.

Instead, the inorganic insulating layer IIL may include a groove rather than the first hole H1 that exposes the buffer layer 111. Alternatively, the inorganic insulating layer IIL may not include the first hole H1 or the groove corresponding to the transmission area TA. Because the inorganic insulating layer IIL generally includes an inorganic insulating material having excellent light transmittance, the inorganic insulating layer IIL has sufficient transmittance without a hole or groove corresponding to the transmission area TA, thereby causing the component to transmit/receive a sufficient amount of light.

The first and second source electrodes S1 and S2 and the first and second drain electrodes D1 and D2 may be arranged on the interlayer insulating layer 115. The first and second source electrodes S1 and S2 and the first and second drain electrodes D1 and D2 each may include a conductive material including Mo, Al, Cu, Ti, etc. and may include a multi-layer or single layer including the above material. As an example, the first and second source electrodes S1 and S2 and the first and second drain electrodes D1 and D2 each may have a multi-layered structure of Ti/Al/Ti.

The planarization layer 117 may be arranged to cover the first and second source electrodes S1 and S2 and the first and second drain electrodes D1 and D2. The planarization layer 117 may include a flat upper surface such that a first pixel electrode 121 and a second pixel electrode 121', which are arranged thereon, are formed flat.

The planarization layer 117 may include an organic material or an inorganic material, and may have a single-layered or multi-layered structure. The planarization layer 117 may include a general-purpose polymer such as benzocyclobutene (BCB), polyimide, hexamethyldisiloxane (HMDSO), polymethylmethacrylate (PMMA) or polystyrene (PS), a polymer derivative having a phenol-based group, an acryl-based polymer, an imide-based polymer, an aryl-ether-based polymer, an amide-based polymer, a fluorine-based polymer, a p-xylene-based polymer, or a vinyl alcohol-based polymer. The planarization layer 117 may include an inorganic insulating material such as $SiO_x$, $SiN_x$, SiON, $Al_2O_3$, $TiO_2$, $Ta_2O_5$, $HfO_2$, or $ZnO_2$. When the planarization layer 117 is formed, in order to provide a flat upper surface after a layer is formed, chemical mechanical polishing may be performed on the upper surface of the layer.

The first and second organic light-emitting diodes OLED and OLED' are arranged on the planarization layer 117. The first and second pixel electrodes 121 and 121' of the first and second organic light-emitting diodes OLED and OLED' may be connected to the pixel circuits PC and PC', respectively.

The planarization layer 117 may include a second hole H2 corresponding to the transmission area TA. The second hole H2 may overlap the first hole H1. In FIG. 9, it is shown that the second hole H2 is formed greater than the first hole H1. In another embodiment, the planarization layer 117 is provided to cover an edge of the first hole H1 of the inorganic insulating layer IIL, and thus, an area of the second hole H2 may be formed smaller than an area of the first hole H1.

The planarization layer 117 may include a via hole that exposes any one of the first source electrode S1 and the first drain electrode D1 of the main thin-film transistor TFT, and the first pixel electrode 121 may be in contact with the first source electrode S1 or the first drain electrode D1 through the via hole, to be electrically connected to the main thin-film transistor TFT. In addition, the planarization layer 117 may include a via hole that exposes any one of the second source electrode S2 and the second drain electrode D2 of the auxiliary thin-film transistor TFT', and the second pixel electrode 121' may be in contact with the second source electrode S2 or the second drain electrode D2 through the via hole, to be electrically connected to the auxiliary thin-film transistor TFT'.

The first pixel electrode 121 and the second pixel electrode 121' each may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The first pixel electrode 121 and the second pixel electrode 121' each may include a reflective layer including Ag, Mg, Al, Pt, Pd, Au, Ni, Nd, Ir, Cr, or a compound thereof. For example, the first pixel electrode 121 and the second pixel electrode 121' each may have a structure of layers including ITO, IZO, ZnO, or $In_2O_3$ on/under the aforementioned reflective layer. In this case, the first pixel electrode 121 and the second pixel electrode 121' each may have a structure in which ITO/Ag/ITO are stacked.

A first pixel-defining layer 119a may be arranged on the planarization layer 117 in the main display area MDA, and a second pixel-defining layer 119b may be arranged on the planarization layer 117 in the component area CA. The first pixel-defining layer 119a may cover an edge of the first pixel electrode 121 and include a first opening OP1 that exposes a portion of the first pixel electrode 121. The second pixel-defining layer 119b may cover an edge of the second pixel electrode 121' and include a second opening OP2 that exposes a portion of the second pixel electrode 121'. Sizes and shapes of emission areas of the main and auxiliary organic light-emitting diodes OLED and OLED', that is, sizes and shapes of the main and auxiliary sub-pixels Pm and Pa, may be defined by the first opening OP1 and the second opening OP2.

The first pixel-defining layer 119a and the second pixel-defining layer 119b may increase a distance between the edges of the first and second pixel electrodes 121 and 121' and an opposite electrode 123 above the first and second pixel electrodes 121 and 121', thereby preventing an arc from occurring at the edges of the first and second pixel electrodes 121 and 121'. The first pixel-defining layer 119a and the second pixel-defining layer 119b may include an organic insulating material such as polyimide, polyamide, acrylic resin, BCB, HMDSO, and phenol resin, and may be formed by using spin coating or the like. In an embodiment, the first pixel-defining layer 119a may include an opaque insulating material, and the second pixel-defining layer 119b may include a transparent insulating material. In another embodiment, both the first pixel-defining layer 119a and the second pixel-defining layer 119b may include an opaque insulating material. A spacer including an organic insulating material may be further provided on each of the first pixel-defining layer 119a and the second pixel-defining layer 119b.

The second pixel-defining layer 119b may include a third hole H3 located in the transmission area TA. The third hole H3 may overlap the first hole H1 and the second hole H2. Light transmittance in the transmission area TA may be improved by the first to third holes H1 to H3. In FIG. 9, it is shown that the buffer layer 111 is continuously arranged to correspond to the transmission area TA, but the buffer layer 111 may include a hole located in the transmission area TA. A portion of the opposite electrode 123, which will be described later, may be arranged on inner surfaces of the first to third holes H1 to H3.

A first emission layer 122b and a second emission layer 122b', which are formed to respectively correspond to the first pixel electrode 121 and the second pixel electrode 121', are arranged inside the first opening OP1 of the first pixel-defining layer 119a and the second opening OP2 of the second pixel-defining layer 119b. The first emission layer 122b and the second emission layer 122b' each may include a polymer material or a low molecular weight material, and emit red, green, blue, or white light.

An organic functional layer 122e may be arranged on and/or under the first emission layer 122b and the second emission layer 122b'. The organic functional layer 122e may include a first functional layer 122a and/or a second functional layer 122c. The first functional layer 122a or the second functional layer 122c may be omitted.

The first functional layer 122a may be under the first emission layer 122b and the second emission layer 122b'. The first functional layer 122a may include a single layer or multi-layer of an organic material. The first functional layer 122a may include a hole transport layer (HTL) which has a single-layered structure. Alternatively, the first functional layer 122a may include a hole injection layer (HIL) and an HTL. The first functional layer 122a may be formed as a single body to correspond to the main and auxiliary organic light-emitting diodes OLED and OLED' respectively included in the main display area MDA and the component area CA.

The second functional layer 122c may be arranged on the first emission layer 122b and the second emission layer 122b'. The second functional layer 122c may include a single layer or multi-layer of an organic material. The second functional layer 122c may include an electron transport layer (ETL) and/or an electron injection layer (EIL). The second functional layer 122c may be formed as a single body to correspond to the main and auxiliary organic light-emitting diodes OLED and OLED' respectively included in the main display area MDA and the component area CA.

The opposite electrode 123 is arranged on the second functional layer 122c. The opposite electrode 123 may include a conductive material having a low work function. For example, the opposite electrode 123 may include a (semi)-transparent layer including Ag, Mg, Al, Pt, Pd, Au, Ni, Nd, Ir, Cr, lithium (Li), Ca, or an alloy thereof. Alternatively, the opposite electrode 123 may further include a layer such as ITO, IZO, ZnO, or $In_2O_3$ on the (semi)-transparent layer. The opposite electrode 123 may be formed as a single body to correspond to the main and auxiliary organic light-emitting diodes OLED and OLED' respectively included in the main display area MDA and the component area CA.

Layers from the first pixel electrode 121 to the opposite electrode 123 formed in the main display area MDA may form the main organic light-emitting diode OLED. Layers from the second pixel electrode 121' to the opposite electrode 123 formed in the component area CA may form the auxiliary organic light-emitting diode OLED'.

An upper layer 150 including an organic material may be formed on the opposite electrode 123. The upper layer 150 may protect the opposite electrode 123 and increase light extraction efficiency. The upper layer 150 may include an organic material having a higher refractive index than the opposite electrode 123. Alternatively, the upper layer 150 may be provided by stacking layers having different refractive indices. For example, the upper layer 150 may be provided by stacking a high refractive index layer/a low refractive index layer/a high refractive index layer. In this case, a refractive index of the high refractive index layer may be 1.7 or more, and a refractive index of the low refractive index layer may be 1.3 or less.

The upper layer 150 may additionally include lithium fluoride (LiF). Alternatively, the upper layer 150 may additionally include an inorganic insulating material such as $SiO_x$, $SiN_x$, etc.

The first functional layer 122a, the second functional layer 122c, the opposite electrode 123, and the upper layer 150 may include a through hole TAH corresponding to the transmission area TA. That is, the first functional layer 122a, the second functional layer 122c, the opposite electrode 123, and the upper layer 150 each may have an opening corresponding to the transmission area TA. The openings may have substantially the same area. For example, an area of the opening of the opposite electrode 123 may be substantially equal to an area of the through hole TAH.

It may be understood that the through hole TAH corresponding to the transmission area TA means that the through hole TAH overlaps the transmission area TA. In this case, the area of the through hole TAH may be smaller than an area of the first hole H1 formed in the inorganic insulating layer IIL. To this end, in FIG. 9, it is shown that a width Wt of the through hole TAH is less than a width of the first hole H1. Here, the area of the through hole TAH may be defined as an area of an opening that has the narrowest area among openings constituting the through hole TAH. The area of the first hole H1 may also be defined as an area of an opening that has the narrowest area among openings constituting the first hole H1.

By the through hole TAH, a portion of the opposite electrode 123 may not be in the transmission area TA, and thus, light transmittance in the transmission area TA may be significantly increased. The opposite electrode 123 provided with the through hole TAH may be formed by using various methods. In an embodiment, after a material forming the opposite electrode 123 is formed on a front surface of the substrate 100, a portion corresponding to the transmission area TA may be removed through laser lift-off to thereby form the opposite electrode 123 including the through hole TAH. In another embodiment, the opposite electrode 123 including the through hole TAH may be formed by using a metal self-patterning (MSP) method. In another embodiment, the opposite electrode 123 including the through hole TAH may also be formed by depositing the opposite electrode 123 using a fine metal mask (FMM).

The bottom metal layer BML in the component area CA may be provided to correspond to the entire component area CA. In this case, the bottom metal layer BML may include a bottom hole BMLH overlapping the transmission area TA. In some embodiments, a shape and size of the transmission area TA may be defined by a shape and size of the bottom hole BMLH.

Figure 10:
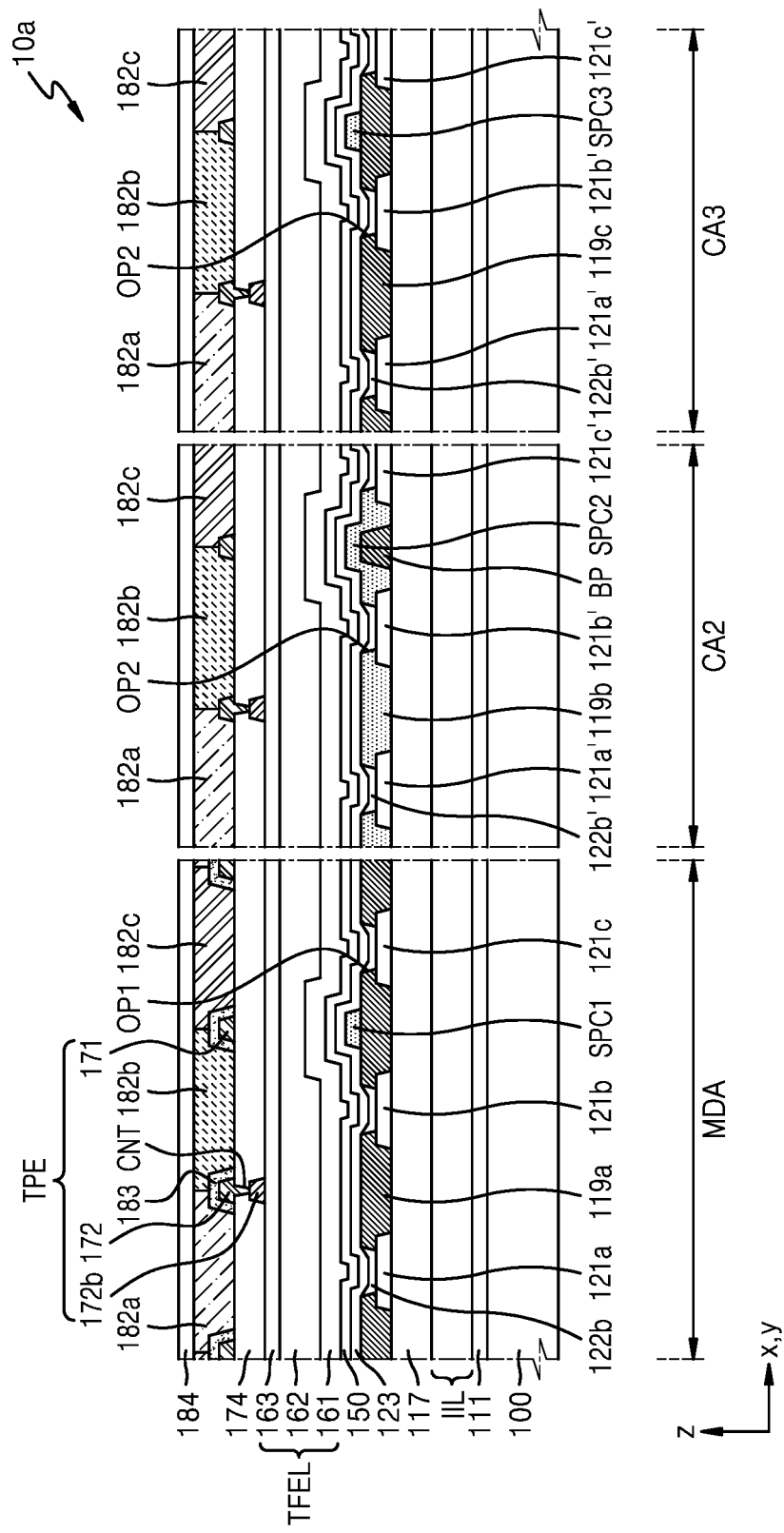
FIG. 10 is a schematic cross-sectional view of a portion of a display panel according to an exemplary embodiment of the invention.
Figure 11:
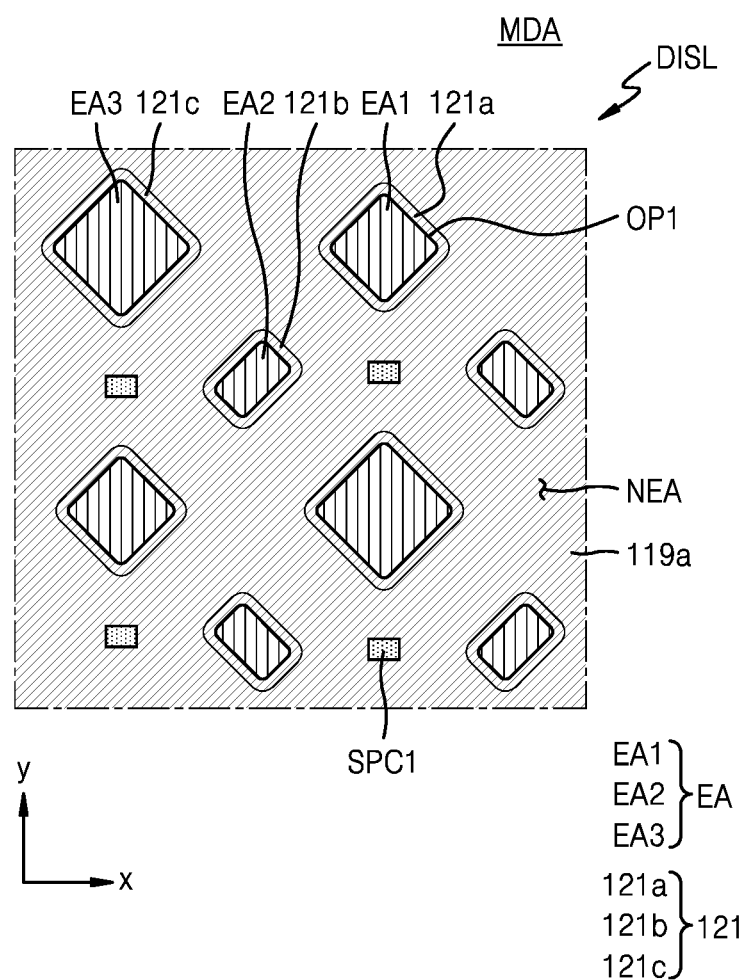
FIG. 11 is a schematic plan view of a display layer of a main display area of FIG. 10.
Figure 12:
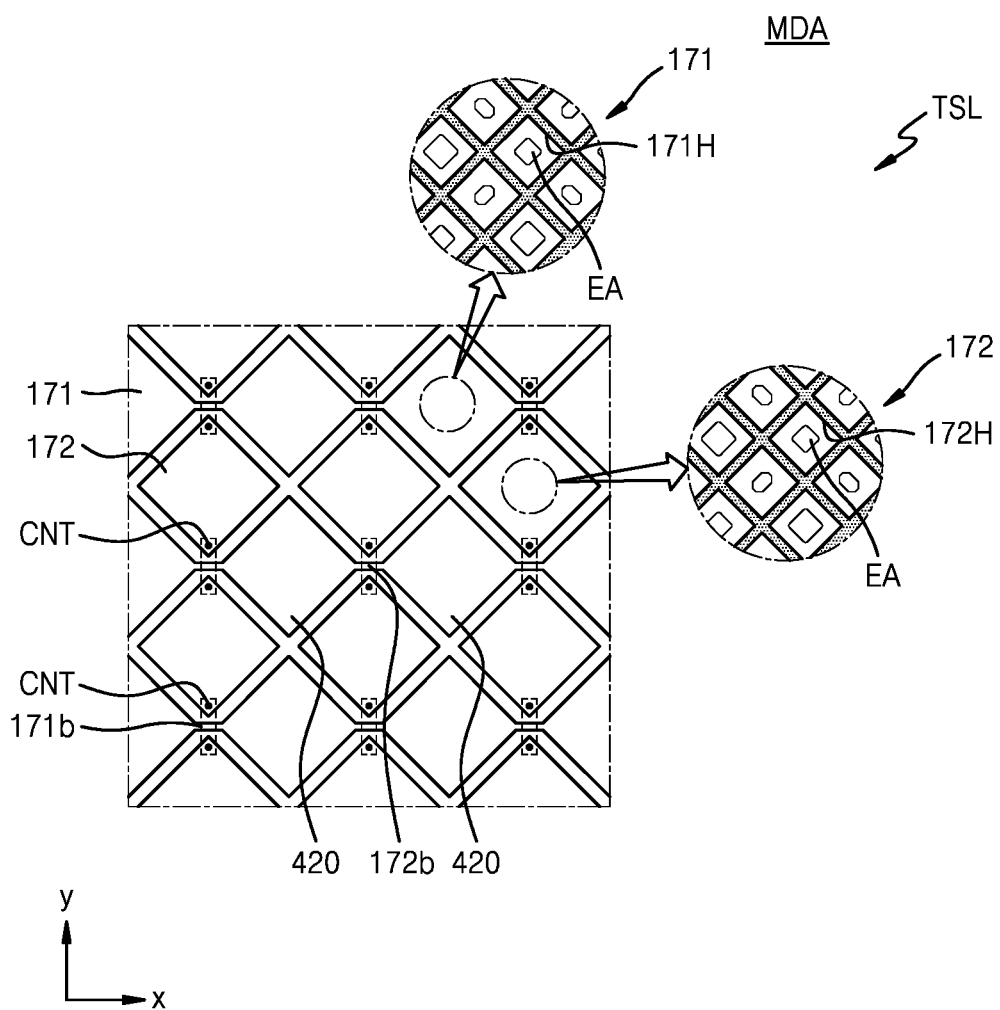
FIG. 12 is a schematic plan view of a touchscreen layer of a main display area of FIG. 10.
Figure 13A:
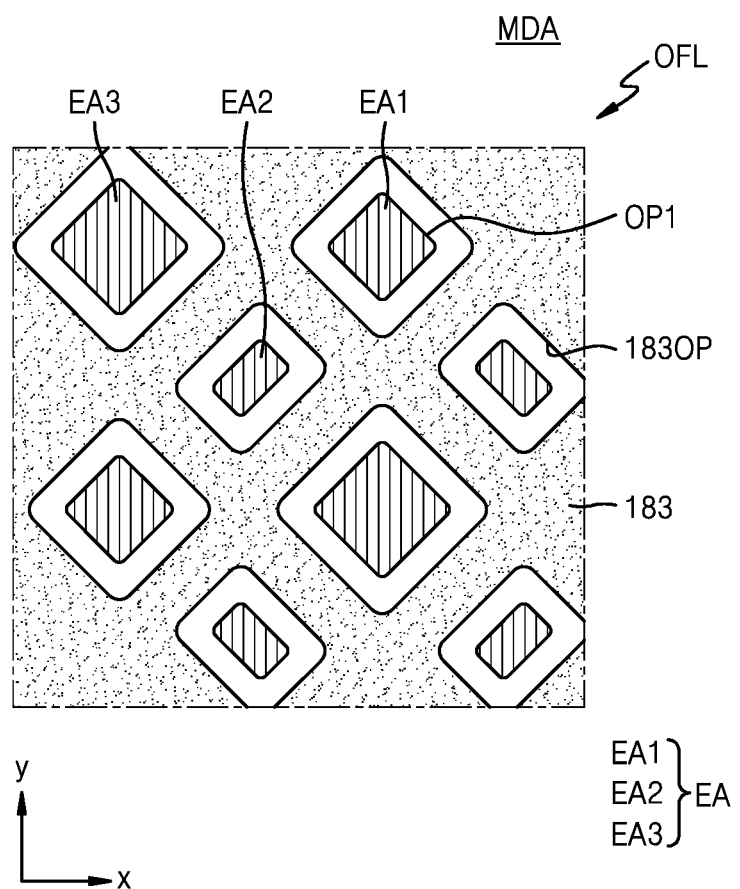
FIGS. 13A and 13B are schematic plan views of an optical functional layer of a main display area of FIG. 10.
Figure 13B:
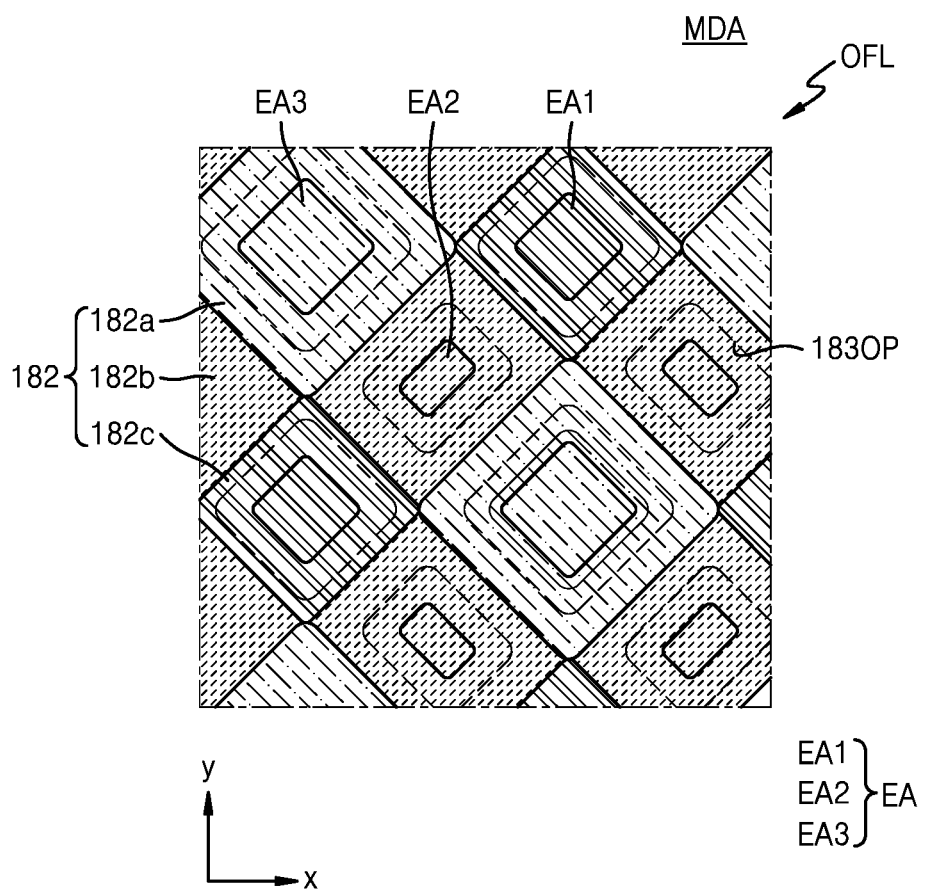

FIG. 10 is a schematic cross-sectional view of a portion of a display panel 10a according to an embodiment. FIG. 10 may be a schematic cross-sectional view of the main display area MDA, and the second and third component areas CA2 and CA3 of FIG. 2. FIG. 11 is a schematic plan view of a display layer DISL of the main display area MDA of FIG. 10. FIG. 12 is a schematic plan view of a touchscreen layer TSL of the main display area MDA of FIG. 10. FIGS. 13A and 13B are schematic plan views of an optical functional layer OFL of the main display area MDA of FIG. 10. FIG.

Figure 15:
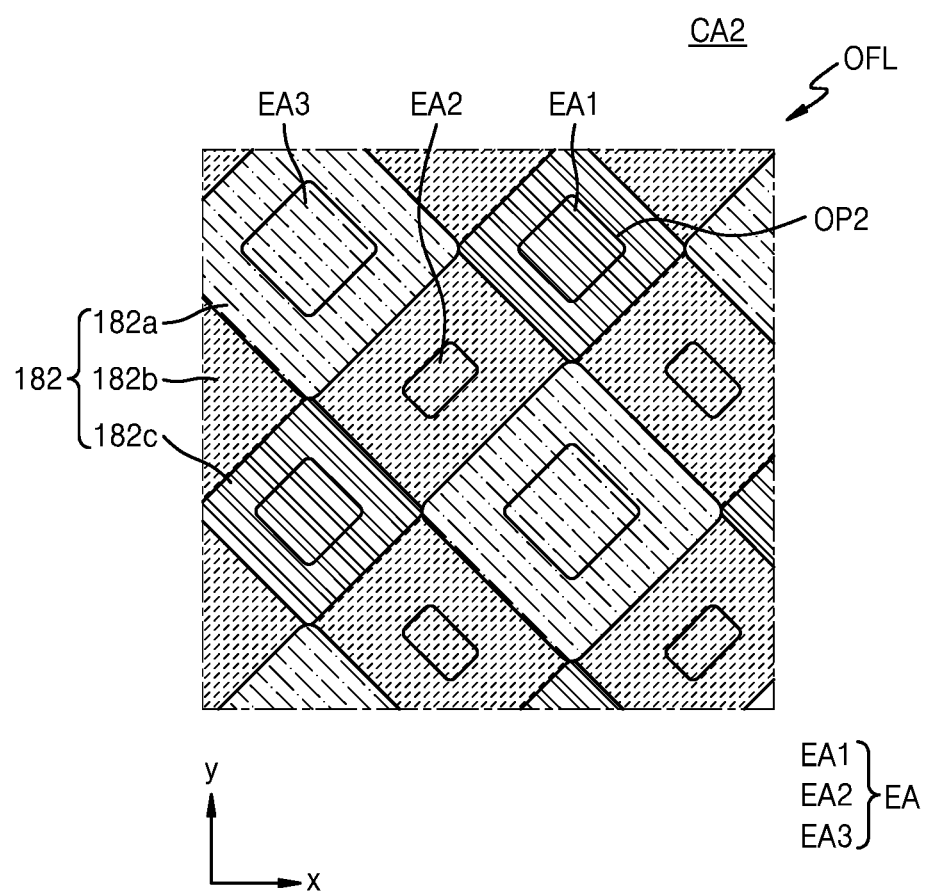
FIG. 15 is a schematic plan view of an optical functional layer of a second component area of FIG. 10.

14 is a schematic plan view of a display layer DISL of the second component area CA2 of FIG. 10. FIG. 15 is a schematic plan view of an optical functional layer OFL of the second component area CA2 of FIG. 10.

The second component area CA2 may be an area in which transmittance of light in a first wavelength band incident on a second component is high, and the third component area CA3 may be an area in which transmittance of light in a second wavelength band incident on a third component is high. For example, an illuminance sensor may be arranged in the second component area CA2, and the second component area CA2 may be an area in which transmittance of visible light (e.g., light having a wavelength of 550 nm) is high. A proximity sensor may be arranged in the third component area CA3, and the third component area CA3 may be an area in which transmittance of infrared light (e.g., light having a wavelength of 940 nm) is high. FIG. 10 shows sub-pixel areas other than transmission areas in the second and third component areas CA2 and CA3.

Referring to FIG. 10, the buffer layer 111, the inorganic insulating layer IIL, and the planarization layer 117 may be sequentially stacked on the substrate 100. The buffer layer 111, the inorganic insulating layer IIL, and the planarization layer 117 may be common layers which are commonly arranged in sub-pixel areas of the main display area MDA, and the second and third component areas CA2 and CA3. As shown in FIG. 9, the main pixel circuit PC and the auxiliary pixel circuit PC' may be between the buffer layer 111 and the planarization layer 117. The display elements of the main sub-pixels Pm and the auxiliary sub-pixels Pa may be arranged on the planarization layer 117. The main sub-pixels Pm and the auxiliary sub-pixels Pa each may include a red sub-pixel, a green sub-pixel, and a blue sub-pixel.

First, the main display area MDA will be described. First pixel electrodes 121 of the main sub-pixels Pm may be arranged in the main display area MDA. The first pixel electrodes 121 may include a first pixel electrode 121a of the red sub-pixel, a first pixel electrode 121b of the green sub-pixel, a first pixel electrode 121c of the blue sub-pixel. A first pixel-defining layer 119a may cover edges of the first pixel electrodes 121a, 121b, and 121c, and may be between the first pixel electrode 121a, the first pixel electrode 121b, and the first pixel electrode 121c. The first pixel-defining layer 119a may include first openings OP1 that expose a portion of the first pixel electrodes 121a, 121b, and 121c. As shown in FIG. 11, the first openings OP1 may correspond to emission areas EA in which first emission layers 122b are arranged. The first pixel-defining layer 119a may be arranged to correspond to a non-emission area NEA between the emission areas EA. The first pixel-defining layer 119a may include an opaque insulating material.

First spacers SPC1 may be arranged on the first pixel-defining layer 119a. The first spacers SPC1 may be arranged at a certain interval in the non-emission area NEA. The first spacers SPC1 each may include a different material from the first pixel-defining layer 119a. For example, the first spacers SPC1 each may include a transparent insulating material.

The emission areas EA may include a first emission area EA1 that emits red light, a second emission area EA2 that emits green light, and a third emission area EA3 that emits blue light. A first emission layer 122b that emits red light may be arranged in the first emission area EA1, a first emission layer 122b that emits green light may be arranged in the second emission area EA2, and a first emission layer 122b that emits blue light may be arranged in the third emission area EA3.

The opposite electrode 123 may be arranged on the first emission layers 122b. The opposite electrode 123 may cover the first pixel-defining layer 119a and the first spacers SPC1. Though not shown in FIG. 10, the first functional layer 122a and/or the second functional layer 122c may be further arranged on and/or under the first emission layers 122b, as shown in FIG. 9.

The upper layer 150 may be arranged on the opposite electrode 123. The thin-film encapsulation layer TFEL may be arranged on the upper layer 150, and the thin-film encapsulation layer TFEL may include first and second encapsulation layers 161 and 163, and an organic encapsulation layer 162 therebetween.

A touchscreen layer TSL may be arranged on the thin-film encapsulation layer TFEL. As shown in FIG. 12, touch electrodes TPE may be provided in the touchscreen layer TSL. The touch electrodes TPE may include first touch electrodes 171 and second touch electrodes 172. The first touch electrodes 171 may be connected to each other by first connection electrodes 171b which are arranged on the same layer. The second touch electrodes 172 may be connected to each other by second connection electrodes 172b which are arranged on different layer from the second touch electrodes 172 and a contact hole CNT of an insulating layer 174.

The first touch electrodes 171 may have a grid structure (or a lattice structure) including a plurality of holes 171H. Each of the holes 171H may be arranged to overlap an emission area EA of a main sub-pixel. Similarly, the second touch electrodes 172 may have a grid structure (or a lattice structure) including a plurality of holes 172H. Each of the holes 172H may be arranged to overlap an emission area EA of a main sub-pixel. The holes 171H and 172H may have different areas. A width of each grid line may be several micrometers.

The optical functional layer OFL may be arranged on the touchscreen layer TSL. The optical functional layer OFL may include the color filter 182, the black matrix 183, and the overcoat layer 184. As shown in FIG. 13A, the black matrix 183 may surround the emission areas EA and may be located to correspond to the first pixel-defining layer 119a. That is, the black matrix 183 may include an opening 183OP corresponding to each emission area EA. A size of the opening 183OP may be greater than a size of each emission area EA. The black matrix 183 may cover the first touch electrodes 171 and the second touch electrodes 172.

The color filter 182 may include a first color filter 182a that selectively transmits only red light, a second color filter 182b that selectively transmits only green light, and a third color filter 182c that selectively transmits only blue light. The first color filter 182a may be arranged to correspond to the first emission area EA1, the second color filter 182b may be arranged to correspond to the second emission area EA2, and the third color filter 182c may be arranged to correspond to the third emission area EA3. The first color filter 182a, the second color filter 182b, and the third color filter 182c may be arranged adjacent to each other. In an embodiment, edges of the first color filter 182a, the second color filter 182b, and the third color filter 182c may overlap edges of a first color filter 182a, a second color filter 182b, and a third color filter 182c, which are adjacent thereto, respectively. The edge of each of the first color filter 182a, the second color filter 182b, and the third color filter 182c may partially overlap the black matrix 183. The first color filter 182a, the second color filter 182b, and third color filter 182c each may have an independent pattern structure. The first color filter 182a, the second color filter 182b, and the third color filter 182c each may partially overlap the first pixel-defining layer 119a.

Figure 14:
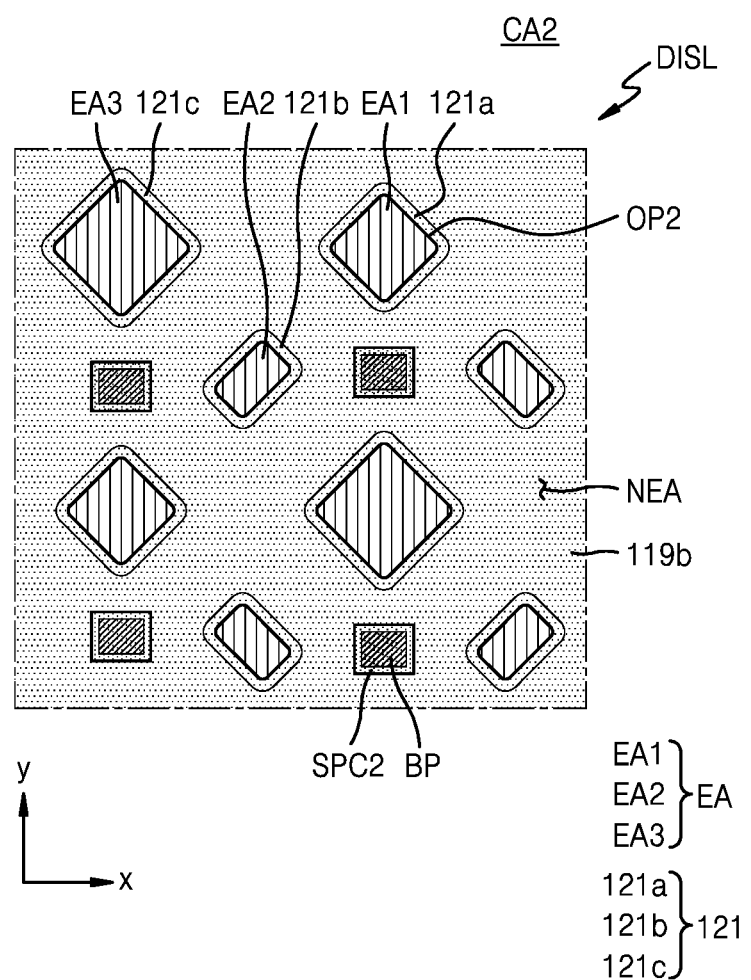
FIG. 14 is a schematic plan view of a display layer of a second component area of FIG. 10.

Next, the second component area CA2 will be described. Second pixel electrodes 121' of the auxiliary sub-pixels Pa may be arranged in the second component area CA2. The second pixel electrodes 121' may include a second pixel electrode 121a' of a red sub-pixel, a second pixel electrode 121b' of a green sub-pixel, a second pixel electrode 121c' of a blue sub-pixel. A second pixel-defining layer 119b may cover edges of the second electrodes 121a', 121b', and 121c', and may be between the second pixel electrode 121a', the second pixel electrode 121b', and the second pixel electrode 121c'. The second pixel-defining layer 119b may include second openings OP2 that expose a portion of the second electrodes 121a', 121b', and 121c'. As shown in FIG. 14, the second openings OP2 may correspond to emission areas EA in which second emission layers 122b' are arranged. The second pixel-defining layer 119b may be arranged to correspond to a non-emission area NEA between the emission areas EA. The second pixel-defining layer 119b may include a different material from the first pixel-defining layer 119a. In an embodiment, the second pixel-defining layer 119b may include the same material as the first spacers SPC1.

Second spacers SPC2 may be arranged at a certain interval in the non-emission area NEA. The second spacers SPC2 each may be arranged on a corresponding insulating pattern BP. The insulating patterns BP may be arranged at a certain in the non-emission area NEA. The insulating patterns BP may be arranged on the planarization layer 117, and the second spacers SPC2 may be portions of the second pixel-defining layer 119b, which cover upper portions of the insulating patterns BP. That is, each second spacer SPC2 may cover each insulating pattern BP. The insulating patterns BP may include the same material as the first pixel-defining layer 119a.

The emission areas EA may include the first emission area EA1 that emits red light, the second emission area EA2 that emits green light, and the third emission area EA3 that emits blue light. A second emission layer 122b' that emits red light may be arranged in the first emission area EA1, a second emission layer 122b' that emits green light may be arranged in the second emission area EA2, and a second emission layer 122b' that emits blue light may be arranged in the third emission area EA3.

The opposite electrode 123 may be arranged on the second emission layers 122b'. The opposite electrode 123 may cover the second pixel-defining layer 119b and the second spacers SPC2. Though not shown in FIG. 10, the first functional layer 122a and/or the second functional layer 122c may be further arranged on and/or under the second emission layer 122b', as shown in FIG. 9.

The upper layer 150 may be arranged on the opposite electrode 123. The thin-film encapsulation layer TFEL may be arranged on the upper layer 150. As shown in FIG. 12, the touchscreen layer TSL may be arranged on the thin-film encapsulation layer TFEL. The optical functional layer OFL may be arranged on the touchscreen layer TSL.

The optical functional layer OFL may include the color filter 182 and the overcoat layer 184. As shown in FIG. 10, the black matrix 183 may not be arranged in the second component area CA2. As shown in FIG. 15, the first color filter 182a may be arranged to correspond to the first emission area EA1, the second color filter 182b may be arranged to correspond to the second emission area EA2, and the third color filter 182c may be arranged to correspond to the third emission area EA3. The first color filter 182a, the second color filter 182b, and the third color filter 182c may be arranged adjacent to each other. In an embodiment, the edges of the first color filter 182a, the second color filter 182b, and the third color filter 182c may overlap the edges of the adjacent first color filter 182a, second color filter 182b, and third color filter 182c, respectively. The first color filter 182a, the second color filter 182b, and third color filter 182c each may have an independent pattern structure. The first color filter 182a, the second color filter 182b, and the third color filter 182c each may partially overlap the second pixel-defining layer 119b.

Next, the third component area CA3 will be described. Second pixel electrodes 121' of the auxiliary sub-pixels Pa may be arranged in the third component area CA3. The second pixel electrodes 121' may include a second pixel electrode 121a' of a red sub-pixel, a second pixel electrode 121b' of a green sub-pixel, a second pixel electrode 121c' of a blue sub-pixel. A third pixel-defining layer 119c may cover edges of the second electrodes 121a', 121b', and 121c', and may be between the second pixel electrode 121a', the second pixel electrode 121b', and the second pixel electrode 121c'. The third pixel-defining layer 119c may include second openings OP2 that expose a portion of the second electrodes 121a', 121b', and 121c'. Third spacers SPC3 may be arranged on the third pixel-defining layer 119c. The third pixel-defining layer 119c may include the same material as the first pixel-defining layer 119a. The third spacers SPC3 may include the same material as the first spacers SPC1.

Arrangements of the third pixel-defining layer 119c and the third spacers SPC3 in the third component area CA3 may be the same as arrangements of the first pixel-defining layer 119a and the first spacers SPC1 in the main display area MDA shown in FIG. 11. An optical functional layer OFL arranged in the third component area CA3 is the same as the optical functional layer OFL arranged in the second component area CA2 shown in FIG. 15.

FIGS. 16A to 16D are cross-sectional views of a display panel 10a according to a manufacturing process of the display panel 10a shown in FIG. 10. Hereinbelow, the same detailed descriptions as described with reference to FIGS. 10 to 15 will be omitted.

Figure 16A:
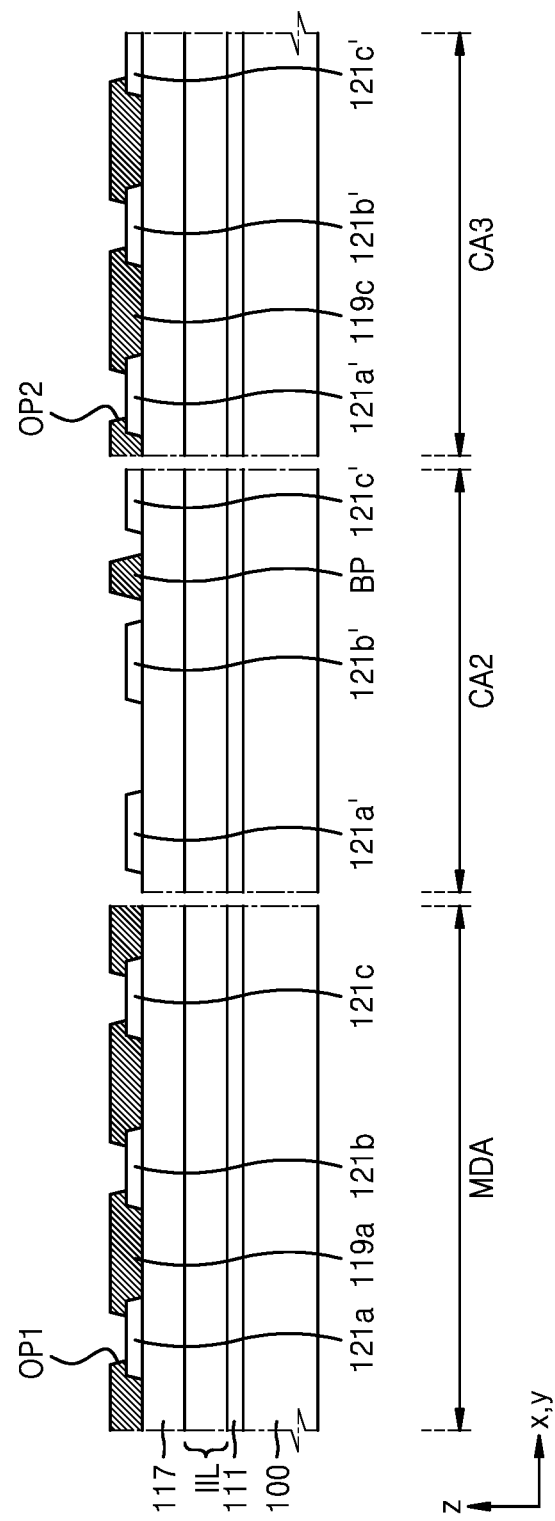
FIGS. 16A, 16B, 16C, and 16D are cross-sectional views of a display panel according to a manufacturing process of the display device shown in FIG. 10.

Referring to FIG. 16A, the buffer layer 111, the inorganic insulating layer IIL, and the planarization layer 117 may be sequentially stacked on the substrate 100. As shown in FIG. 9, the main pixel circuit PC and the auxiliary pixel circuit PC' may be between the buffer layer 111 and the planarization layer 117.

A conductive material layer is formed on the planarization layer 117 and is then patterned, and thus, the first pixel electrodes 121a, 121b, and 121c of the main sub-pixels may be formed in the main display area MDA, and the second electrodes 121a', 121b', and 121c' of the auxiliary sub-pixels may be formed in each of the second component area CA2 and the third component area CA3.

A first insulating layer may be formed in the main display area MDA, the second component area CA2, and third component area CA3, and may be exposed by using a mask. The first insulating layer may include a negative photosensitive material. The exposed first insulating layer may be developed to thereby form the first pixel-defining layer 119a in the main display area MDA, the insulating pattern BP in the second component area CA2, and the third pixel-defining layer 119c in the third component area CA3.

The first insulating layer may include an opaque material. The first insulating layer may include a colored material. For example, the first pixel-defining layer 119a, the insulating pattern BP, and the third pixel-defining layer 119c, which are formed from the first insulating layer, may include colored pigments, e.g., white, black, or other colored pigments. In an embodiment, the first insulating layer may include a black pigment. For example, the first pixel-defining layer 119a, the insulating pattern BP, and the third pixel-defining layer 119c may include a polyimide (PI)-based binder, and a pigment in which red, green, and blue pigments are mixed. Alternatively, the first pixel-defining layer 119a, the insulating pattern BP, and the third pixel-defining layer 119c may include a cardo-based binder resin and a mixture of lactam-based black pigment and blue pigment. Alternatively, the first pixel-defining layer 119a, the insulating pattern BP, and the third pixel-defining layer 119c may include carbon black.

The first pixel-defining layer 119a may include a first opening OP1 that exposes a portion of the first pixel electrodes 121a, 121b, and 121c, and may directly cover the first pixel electrodes 121a, 121b, and 121c by overlapping edges of the first pixel electrodes 121a, 121b, and 121c. The third pixel-defining layer 119c may include a second opening OP2 that exposes a portion of the second pixel electrodes 121a', 121b', and 121c', and may directly cover the second pixel electrodes 121a', 121b', and 121c' by overlapping edges of the second pixel electrodes 121a', 121b', and 121c' in the third component area CA3. The insulating patterns BP may be between the second pixel electrodes 121a', 121b', and 121c' in the second component area CA2.

Figure 16B:
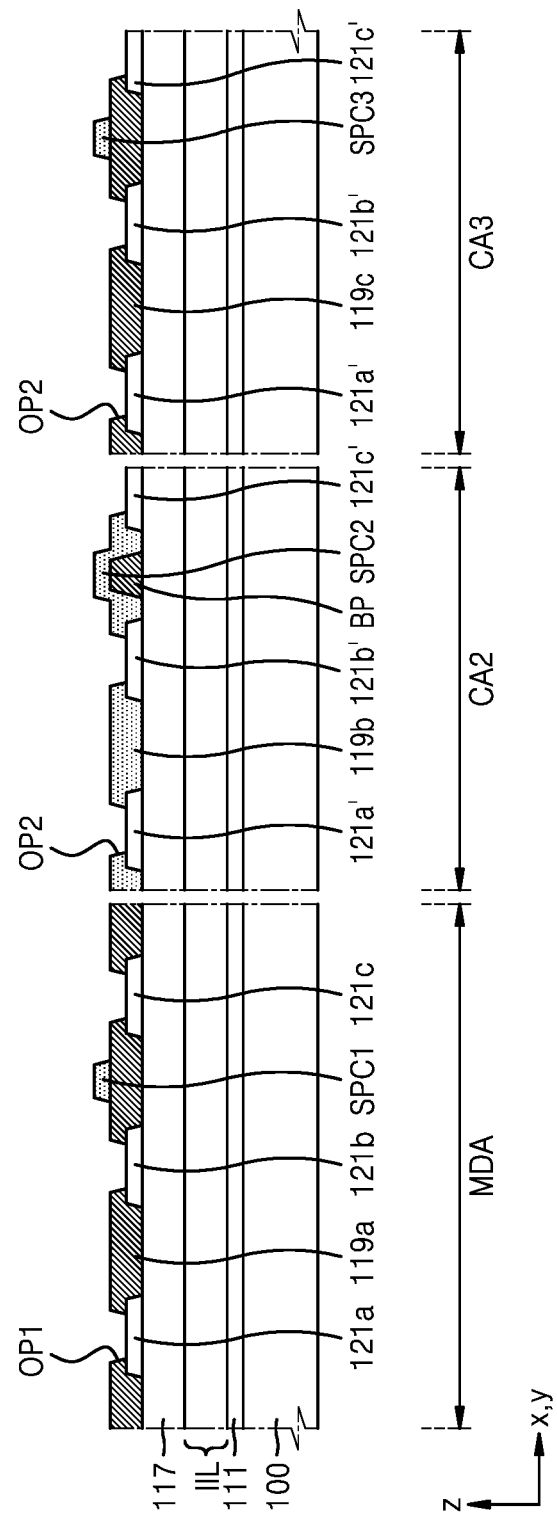

Referring to FIG. 16B, a second insulating layer may be formed on the first pixel-defining layer 119a, the insulating pattern BP, and the third pixel-defining layer 119c, and may be exposed by using a mask. The second insulating layer may include a positive photosensitive material. The exposed second insulating layer may be developed to thereby form the first spacer SPC1 in the main display area MDA, the second pixel-defining layer 119b and the second spacer SPC2 in the second component area CA2, and the third spacer SPC3 in the third component area CA3.

The first spacer SPC1 may be on the first pixel-defining layer 119a, and the third spacer SPC3 may be on the third pixel-defining layer 119c.

The second pixel-defining layer 119b may include a second opening OP2 that exposes a portion of the second electrodes 121a', 121b', and 121c', and may directly cover the second electrodes 121a', 121b', and 121c' by overlapping edges of the second electrodes 121a', 121b', and 121c' in the second component area CA2. The second pixel-defining layer 119b may cover the insulating pattern BP and have a step with a partially different height by the insulating pattern BP. A portion of the second pixel-defining layer 119b, which is relatively high in height, that is, a portion arranged on the insulating pattern BP, may function as the second spacer SPC2.

By a mask used in a process of forming first and second emission layers 122b and 122b' to be described later, the first spacer SPC1, the second spacer SPC2, and the third spacer SPC3 may prevent damage to layers arranged under the mask, for example, the first and second pixel electrodes 121 and 121', etc.

The second insulating layer may include a different material from the first insulating layer. The second insulating layer may include a transparent insulating material. For example, the second pixel-defining layer 119b, the first spacer SPC1, the second spacer SPC2, and the third spacer SPC3, which are formed from the second insulating layer, may include a polyimide-based resin, e.g., a photosensitive polyimide-based resin.

Figure 16C:
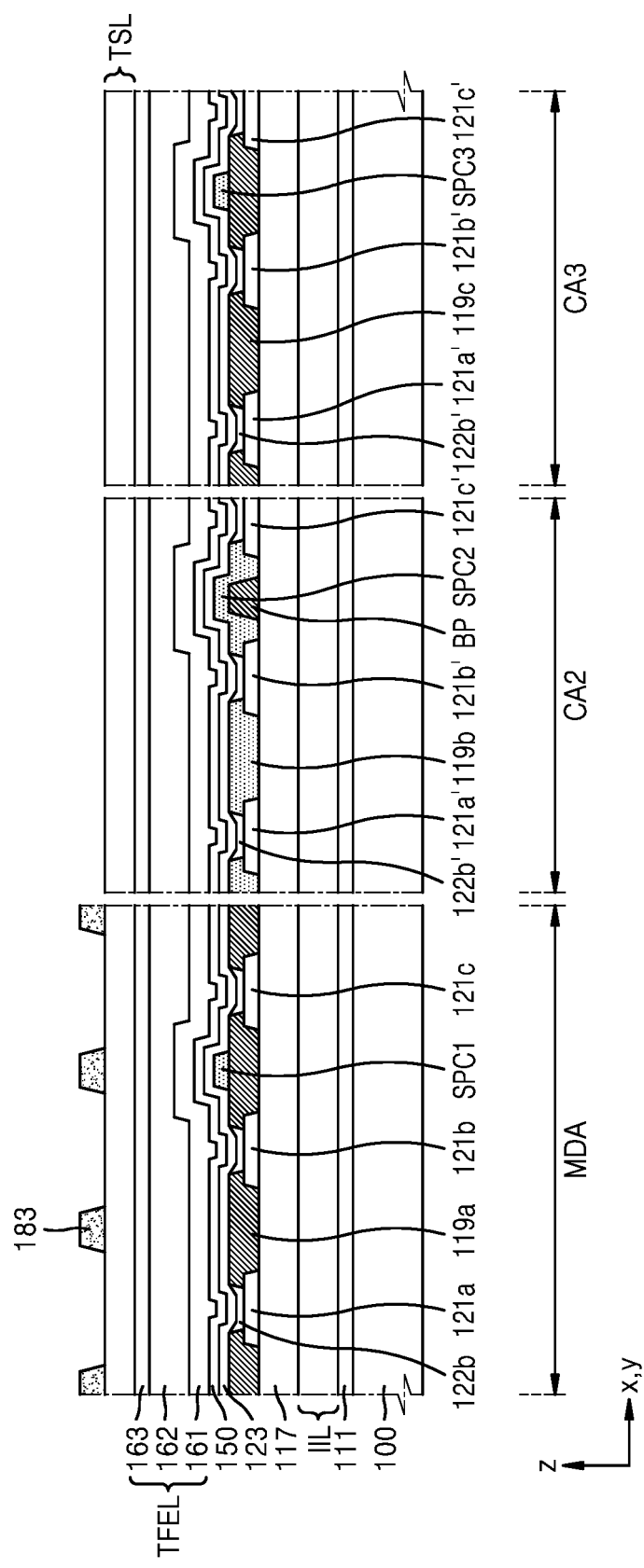

Next, as shown in FIG. 16C, the first and second emission layers 122b and 122b' may be formed in the first opening OP1 of the first pixel-defining layer 119a, and the second openings OP2 of the second pixel-defining layer 119b and the third pixel-defining layer 119c, and the opposite electrode 123 may be formed on the first and second emission layers 122b and 122b'.

As shown in FIG. 9, the first functional layer 122a and/or the second functional layer 122c may be further arranged on and/or under the first and second emission layers 122b and 122b'. The first and second emission layers 122b and 122b' may be formed to overlap only the first and second pixel electrodes 121a, 121b, and 121c, and 121a', 121b', and 121c', respectively. The first and second functional layers 122a and 122c and the opposite electrode 123 may be formed to entirely cover the substrate 100. The first and second functional layers 122a and 122c and the opposite electrode 123 may not be provided in the transmission areas of the second and third component areas CA2 and CA3.

The upper layer 150 may be formed on the opposite electrode 123, and the thin-film encapsulation layer TFEL and the touchscreen layer TSL may be sequentially formed on the upper layer 150.

The thin-film encapsulation layer TFEL may include the first and second encapsulation layers 161 and 163, and the organic encapsulation layer 162 therebetween. The first and second encapsulation layers 161 and 163 may include one or more inorganic insulating materials such as aluminum oxide, titanium oxide, tantalum oxide, hafnium oxide, zinc oxide, silicon oxide, silicon nitride, silicon oxynitride, etc. The organic encapsulation layer 162 may include a polymer-based material. Examples of the polymer-based material may include an acrylic resin, an epoxy resin, polyimide, polyethylene, etc.

As shown in FIG. 10, the touchscreen layer TSL may include the first and second touch electrodes 171 and 172, first and second connection electrodes 171b and 172b, and the insulating layer 174.

The black matrix 183 may be formed on the touchscreen layer TSL. The black matrix 183 may be formed in the main display area MDA and may be arranged to overlap the first pixel-defining layer 119a.

Figure 16D:
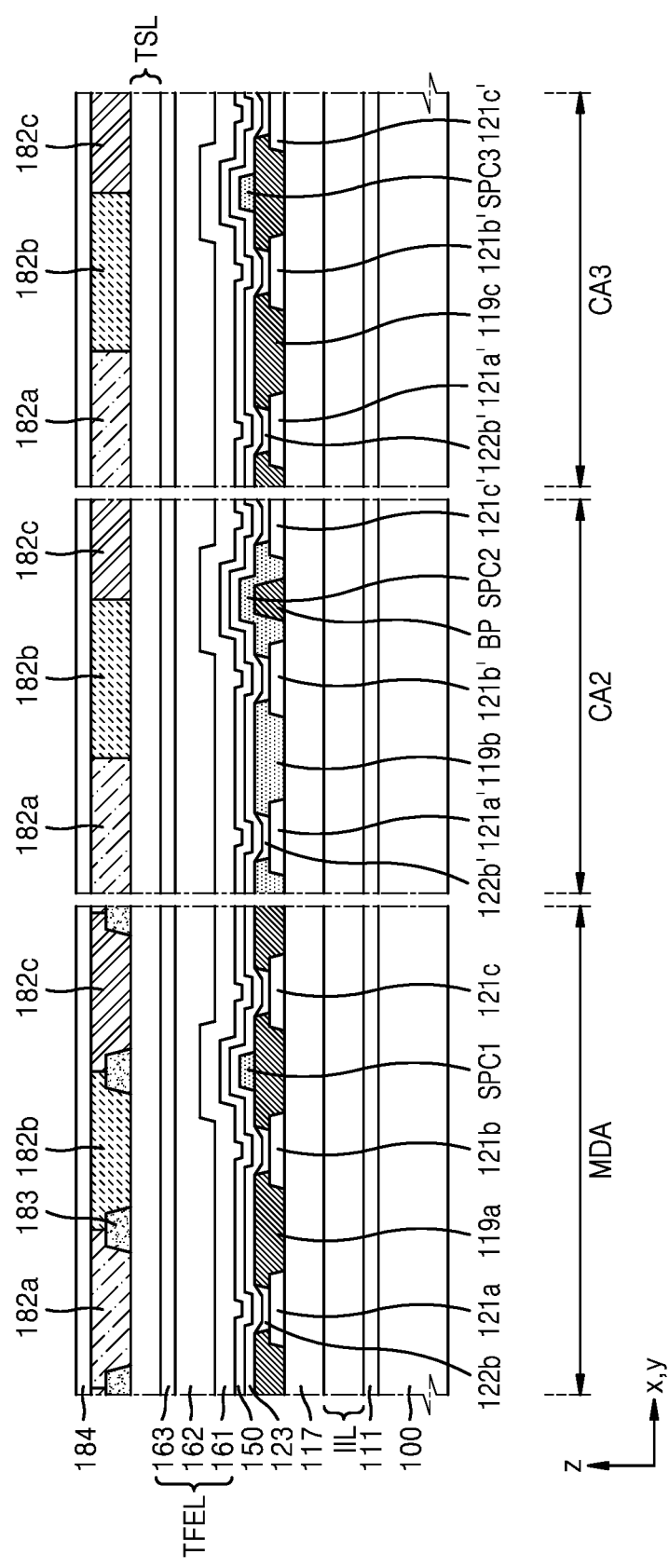

Referring to FIG. 16D, the color filter 182 and the overcoat layer 184 may be formed on the touchscreen layer TSL. The first color filter 182a, the second color filter 182b, and the third color filter 182c may be arranged to overlap the first opening OP1 of the first pixel-defining layer 119a and the second openings OP2 of the second and third pixel-defining layers 119b and 119c, respectively.

Figure 17A:
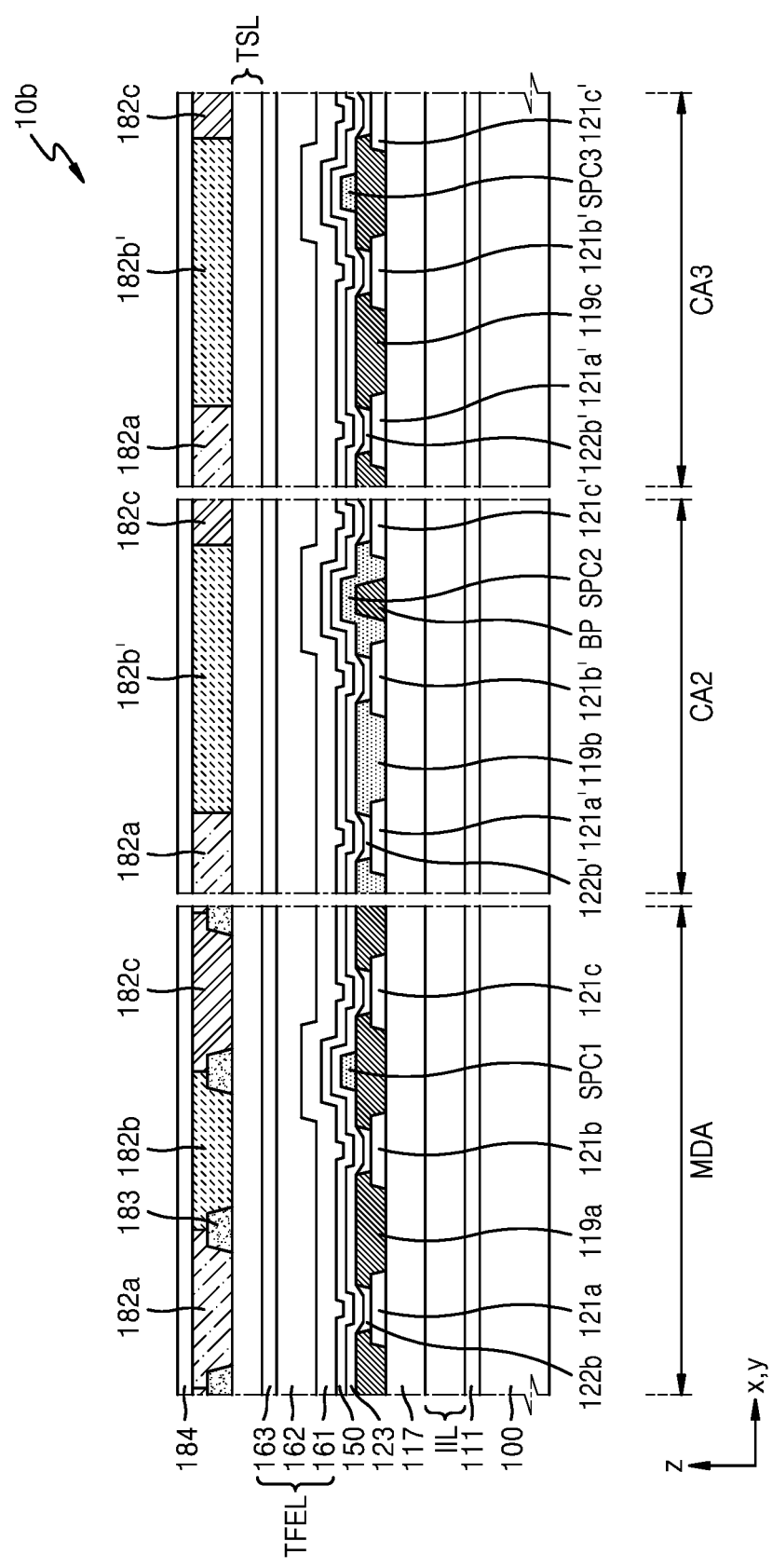
FIG. 17A is a schematic cross-sectional view of a portion of a display panel according to an exemplary embodiment of the invention.
Figure 17B:
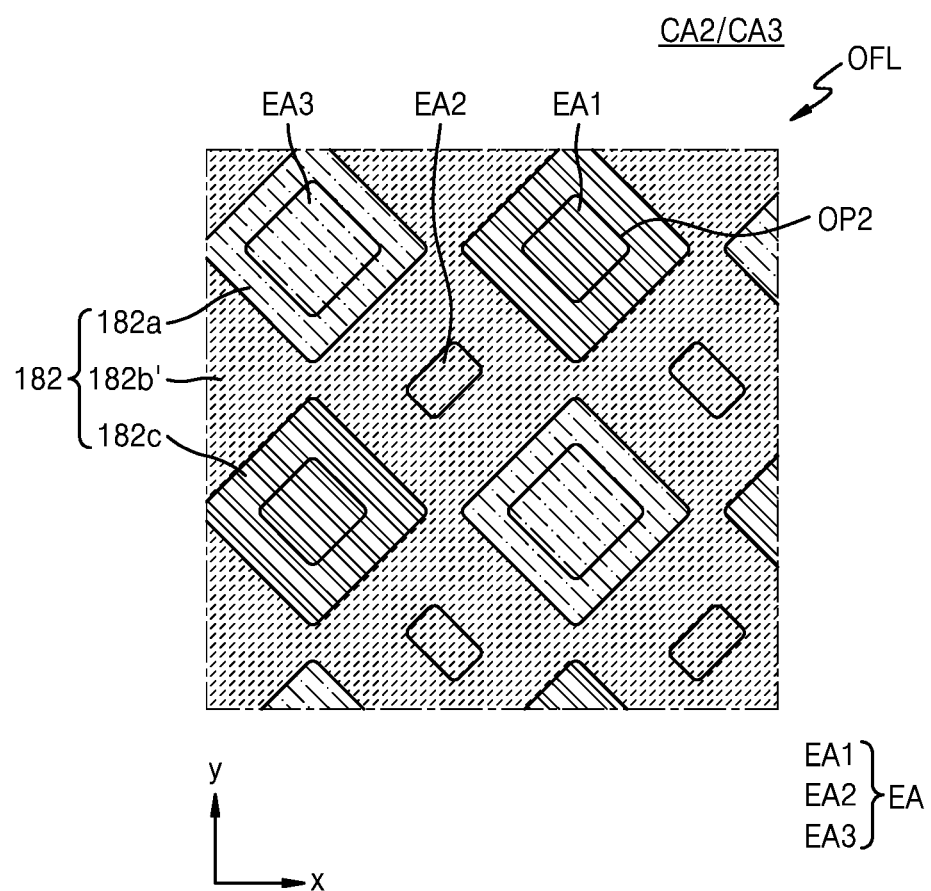
FIG. 17B is a schematic plan view of an optical functional layer of second and third component areas of FIG. 17A.

FIG. 17A is a schematic cross-sectional view of a portion of a display panel 10b according to an embodiment. FIG. 17B is a schematic plan view of an optical functional layer OFL of second and third component areas CA2 and CA3 of FIG. 17A.

The display panel 10b shown in FIG. 17A may have an optical functional layer OFL of second and third component areas CA2 and CA3, which is different from that of the display panel 10a shown in FIG. 10, and other elements are the same as those of the display panel 10a shown in FIG. 10.

Referring to FIGS. 17A and 17B, the optical functional layer OFL of the second and third component areas CA2 and CA3 may include a color filter 182. The color filter 182 may include a first color filter 182a, a second color filter 182b', and a third color filter 182c. The first color filter 182a and the third color filter 182c may have an independent pattern structure, and the second color filter 182b' may have a lattice structure. The first color filter 182a, the second color filter 182b', and the third color filter 182c each may partially overlap the second pixel-defining layer 119b and the third pixel-defining layer 119c. In this case, an area in which the second color filter 182b' overlaps the second pixel-defining layer 119b and the third pixel-defining layer 119c may be greater than an area in which each of the first color filter 182a and the third color filter 182c overlaps the second pixel-defining layer 119b and the third pixel-defining layer 119c.

Figure 18A:
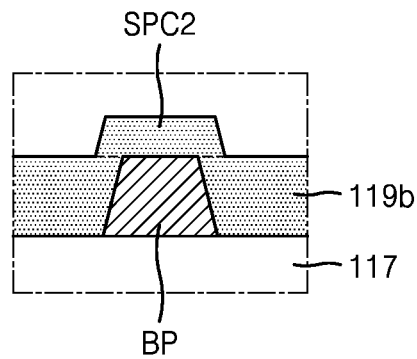
FIGS. 18A and 18B are cross-sectional views of a second spacer according to exemplary embodiments of the invention.
Figure 18B:
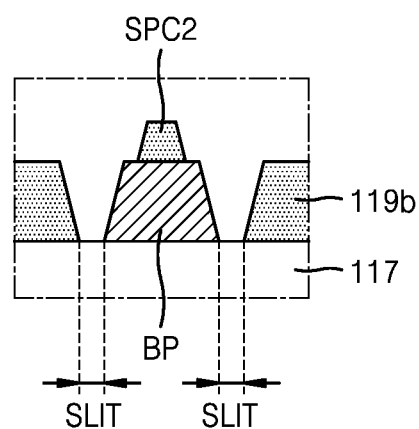

FIGS. 18A and 18B are cross-sectional views of a second spacer SPC2 according to embodiments.

In an embodiment, as shown in FIG. 18A, the second pixel-defining layer 119b may cover the insulating pattern BP and may be formed on the insulating pattern BP. The second pixel-defining layer 119b may have a step with a different height by the insulating pattern BP, and a portion of the second pixel-defining layer 119b, which is located on the insulating pattern BP, may function as the second spacer SPC2.

In another embodiment, as shown in FIG. 18B, the second pixel-defining layer 119b on the insulating pattern BP may be patterned to thereby form the second spacer SPC2 on the insulating pattern BP. Accordingly, the second spacer SPC2 may be separated from the second pixel-defining layer 119b and formed in an independent pattern. The second pixel-defining layer 119b may further include an opening surrounding the insulating pattern BP, and thus slits SLIT surrounding the insulating pattern BP may be formed between the second pixel-defining layer 119b and the insulating pattern BP. An upper surface of the planarization layer 117 may be exposed by the slits SLIT. A step formed by the insulating pattern BP and the second spacer SPC2 in the embodiment shown in FIG. 18B is greater than a step formed by the insulating pattern BP and the second pixel-defining layer 119b in the embodiment shown in FIG. 18A, and thus, the embodiment shown in FIG. 18B may be more advantageous for a subsequent process.

Figure 19A:
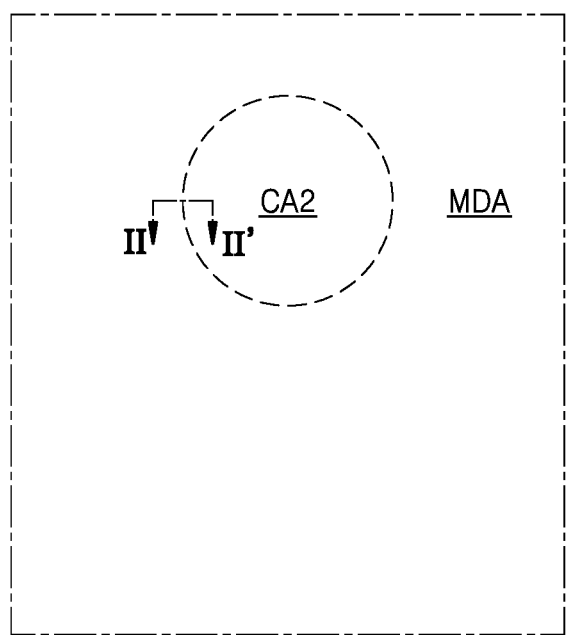
FIGS. 19A and 19B are a plan view and a cross-sectional view of an arrangement of a pixel-defining layer at a boundary between a main display area and a second component area, respectively.
Figure 19B:
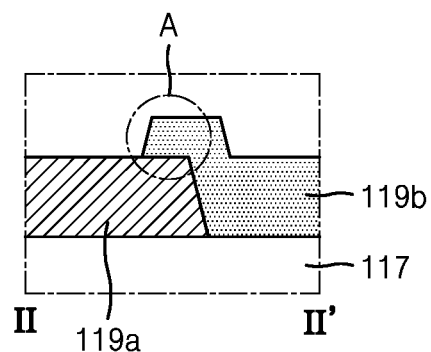

FIGS. 19A and 19B are a plan view and a cross-sectional view of an arrangement of a pixel-defining layer at a boundary between a main display area MDA and a second component area CA2, respectively.

Referring to FIGS. 19A and 19B together, as shown in area A, an edge of the second pixel-defining layer 119b arranged in the second component area CA2 may overlap an edge of the first pixel-defining layer 119a arranged in the main display area MDA and contact the edge of the first pixel-defining layer 119a.

Figure 20:
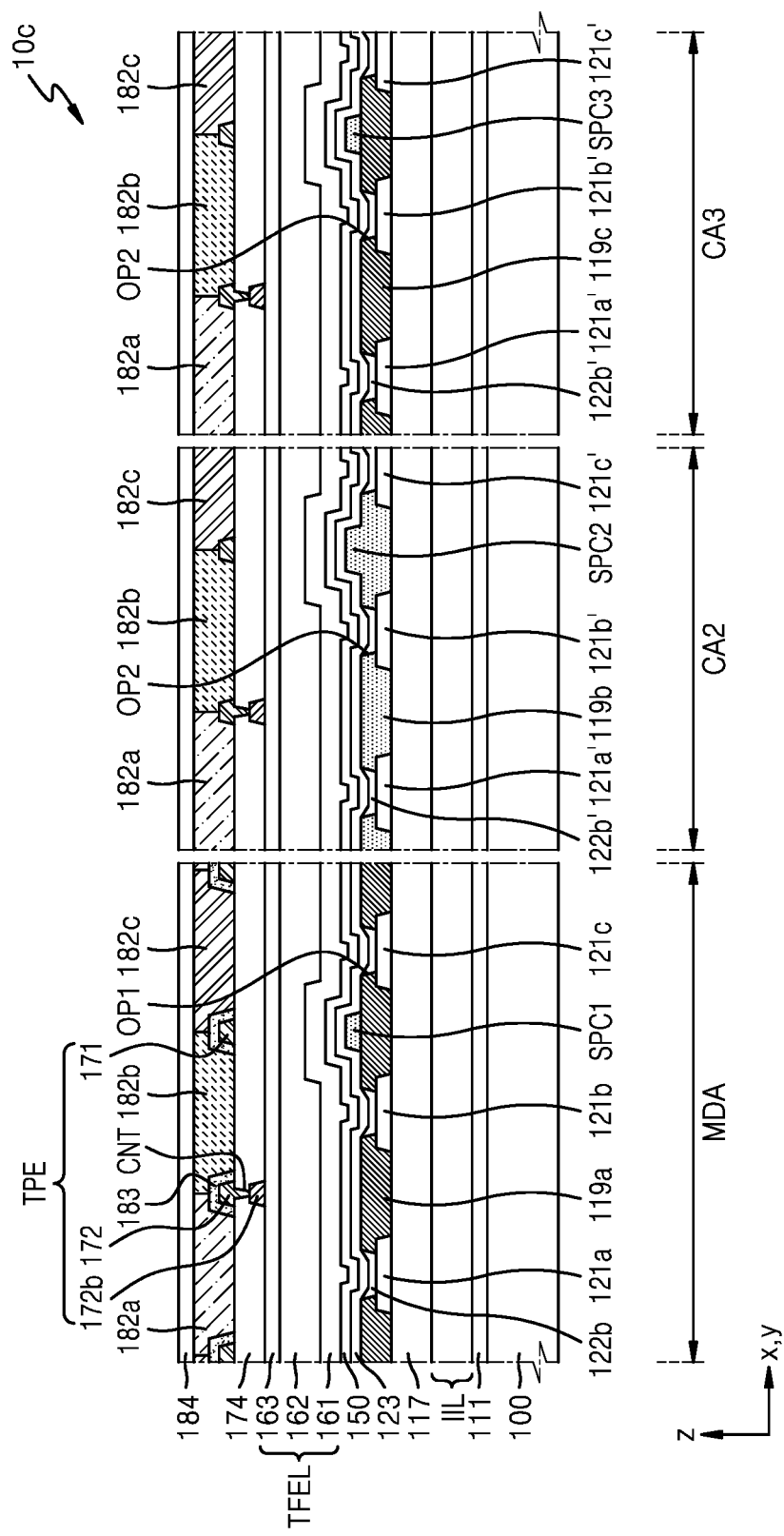
FIG. 20 is a schematic plan view of a portion of a display panel according to an exemplary embodiment of the invention.
Figure 21:
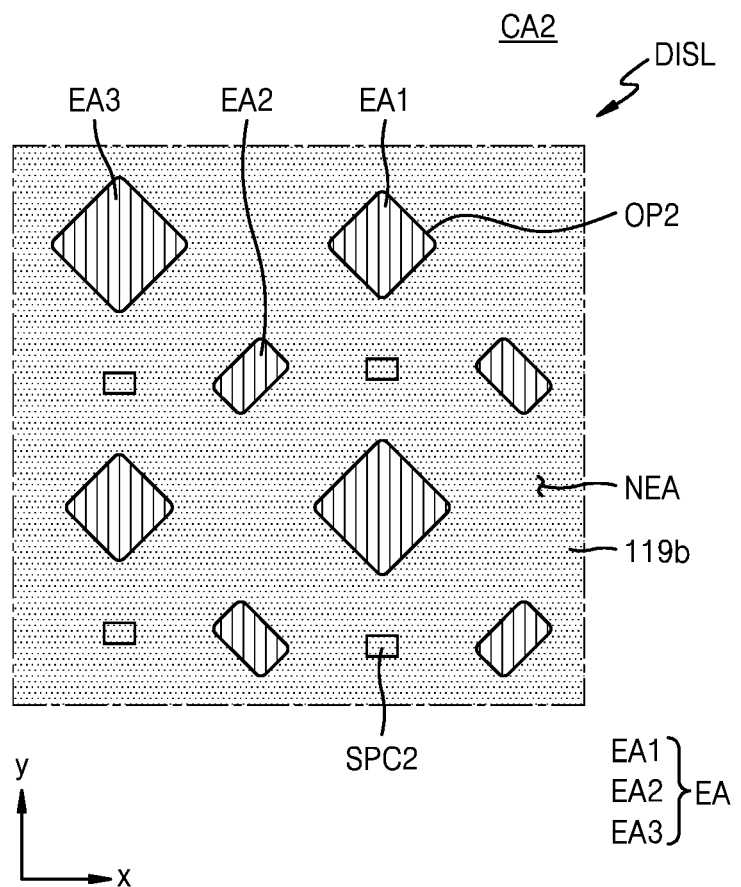
FIG. 21 is a schematic plan view of a display layer of a second component area of FIG. 20.

FIG. 20 is a schematic plan view of a portion of a display panel 10c according to an embodiment. FIG. 21 is a schematic plan view of a display layer DISL of a second component area CA2 of FIG. 20.

The display panel 10c shown in FIG. 20 may have a display layer DISL of a second component area CA2, which is different from that of the display panel 10a shown in FIG. 10, and other elements are the same as those of the display panel 10a shown in FIG. 10.

A first pixel-defining layer 119a that covers edges of the first pixel electrodes 121a, 121b, and 121c may be arranged in the main display area MDA, and the first spacers SPC1 may be arranged on the first pixel-defining layer 119a.

A third pixel-defining layer 119c that covers edges of the second electrodes 121a', 121b', and 121c' may be arranged in the third component area CA3, and the third spacers SPC3 may be arranged on the third pixel-defining layer 119c.

As shown in FIGS. 20 and 21, a second pixel-defining layer 119b that covers edges of the second electrodes 121a', 121b', and 121c' may be arranged in the second component area CA2. The second pixel-defining layer 119b may have a step with a partially different height. A protruding portion of the second pixel-defining layer 119b, which is relatively high in height, may function as the second spacer SPC2. The second pixel-defining layer 119b and the second spacer SPC2 may be formed as a single body.

The first pixel-defining layer 119a and the third pixel-defining layer 119c may be formed from the first insulating layer including an opaque material in the main display area MDA and the third component area CA3, respectively. In this case, unlike FIG. 16A, the insulating pattern BP is not formed in the second component area CA2.

Next, the first spacer SPC1 and the third spacer SPC3 may be formed from the second insulating layer including a transparent material in the main display area MDA and the third component area CA3, respectively, and the second pixel-defining layer 119b and the second spacer SPC2 may be formed in the second component area CA2. Unlike FIG. 16B, the second pixel-defining layer 119b and the second spacer SPC2, which have different heights, may be formed in the second component area CA2 from the second insulating layer through an exposure and development process using a mask having a different transmittance for each area, such as a half-tone mask. In the present specification, the height refers to a height from an upper surface of the substrate 100. A height of the second spacer SPC2 from the substrate 100 may be higher than a height of the second pixel-defining layer 119b from the substrate 100.

Figure 22:
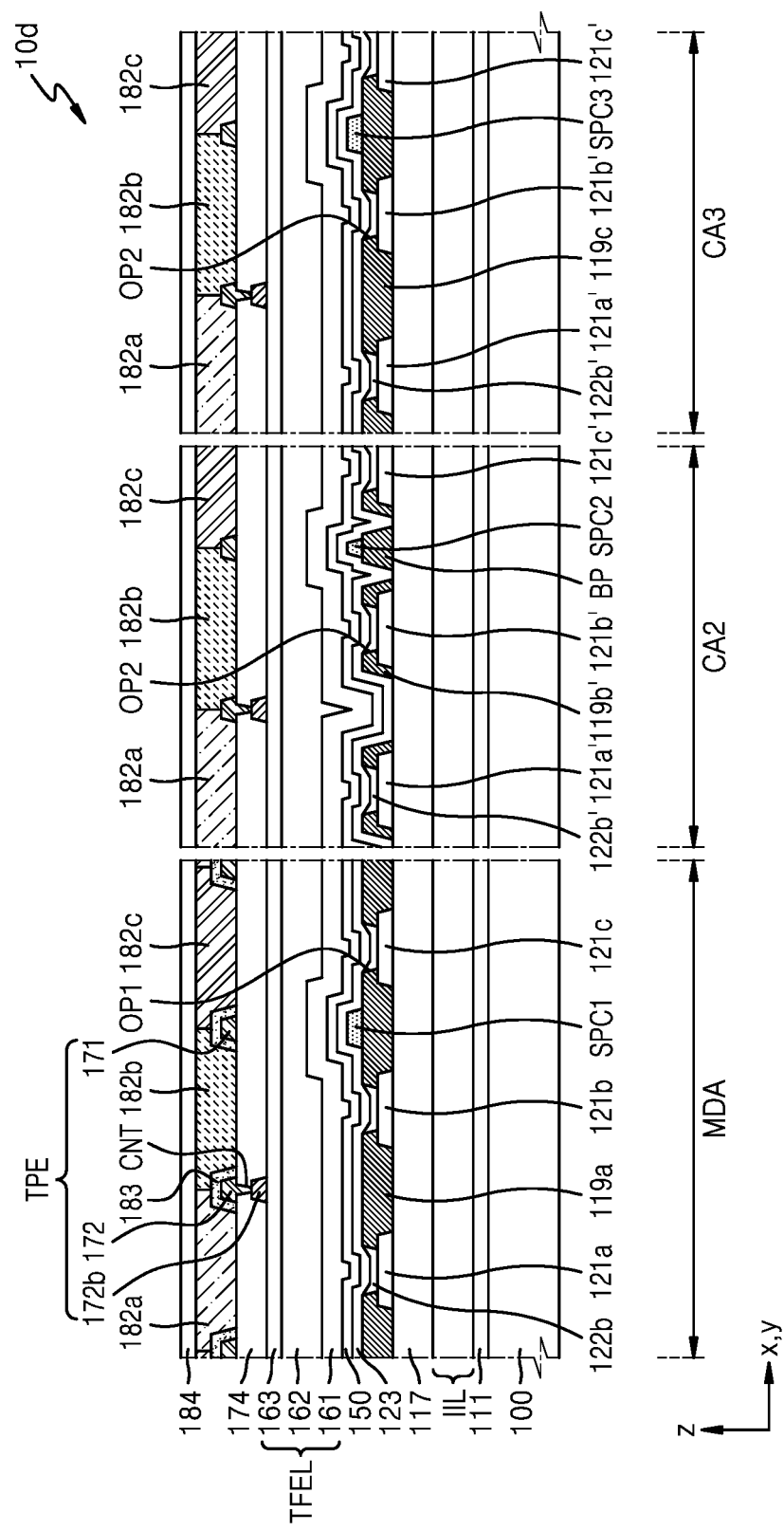
FIG. 22 is a schematic cross-sectional view of a portion of a display panel according to an exemplary embodiment of the invention.
Figure 23:
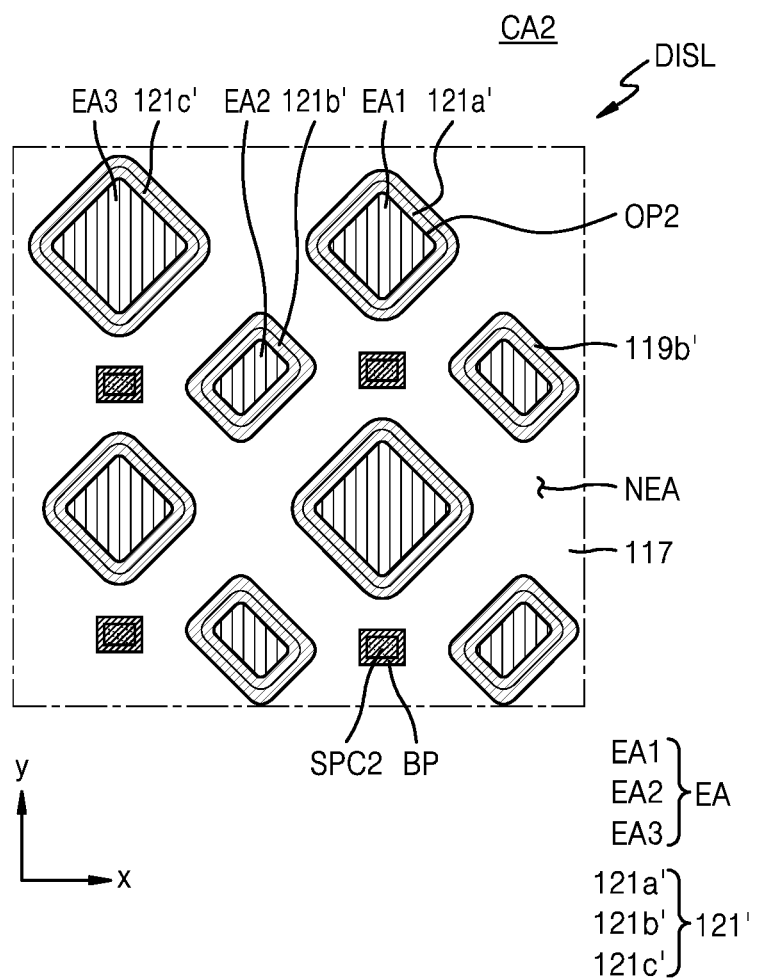
FIG. 23 is a schematic plan view of a display layer of a second component area of FIG. 22.

FIG. 22 is a schematic cross-sectional view of a portion of a display panel 10d according to an embodiment. FIG. 23 is a schematic plan view of a display layer DISL of a second component area CA2 of FIG. 22.

The display panel 10d shown in FIG. 22 may have a display layer DISL of a second component area CA2, which is different from that of the display panel 10a shown in FIG. 10, and other elements are the same as those of the display panel 10a shown in FIG. 10.

A first pixel-defining layer 119a that covers edges of the first pixel electrodes 121a, 121b, and 121c may be arranged in the main display area MDA, and the first spacers SPC1 may be arranged on the first pixel-defining layer 119a.

A third pixel-defining layer 119c that covers edges of the second electrodes 121a', 121b', and 121c' may be arranged in the third component area CA3, and the third spacers SPC3 may be arranged on the third pixel-defining layer 119c.

A second pixel-defining layer 119b' that covers edges of the second electrodes 121a', 121b', and 121c' may be arranged in the second component area CA2. As shown in FIG. 23, the second pixel-defining layer 119b' may include first insulating patterns surrounding the edges of the second electrodes 121a', 121b', and 121c'. A second insulating pattern BP may be further arranged among the second electrodes 121a', 121b', and 121c' in the second component area CA2. The second insulating pattern BP may be between the first insulating patterns and may be spaced apart from the first insulating patterns. A corresponding second spacer SPC2 may be arranged on each of the insulating patterns BP.

The first pixel-defining layer 119a, the second pixel-defining layer 119b', the second insulating pattern BP, and the third pixel-defining layer 119c may be formed from the first insulating layer including an opaque material in the main display area MDA, the second component area CA2, and the third component area CA3, respectively.

Next, the first spacer SPC1 and the third spacer SPC3 may be formed from the second insulating layer including a transparent material in the main display area MDA and the third component area CA3, respectively, and the second spacer SPC2 may be formed in the second component area CA2.

In the present embodiment, since an area occupied by the second pixel-defining layer 119b' in the second component area CA2 is limited to the vicinity of the second pixel electrodes 121', even though the second pixel-defining layer 119b' includes an opaque insulating material, light transmittance of the second component area CA2 may be ensured.

Figure 24:
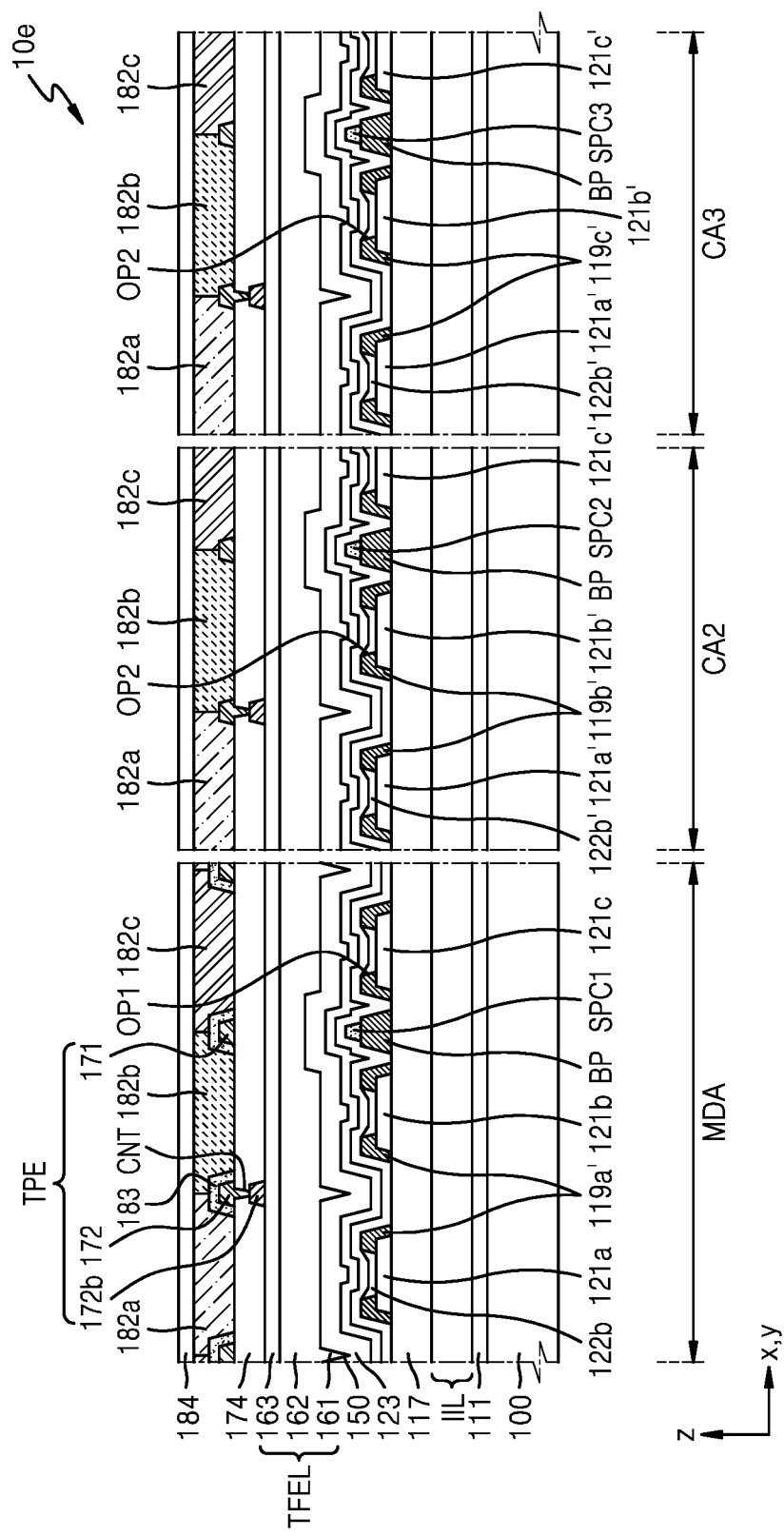
FIG. 24 is a schematic cross-sectional view of a portion of a display panel according to an exemplary embodiment of the invention.
Figure 25:
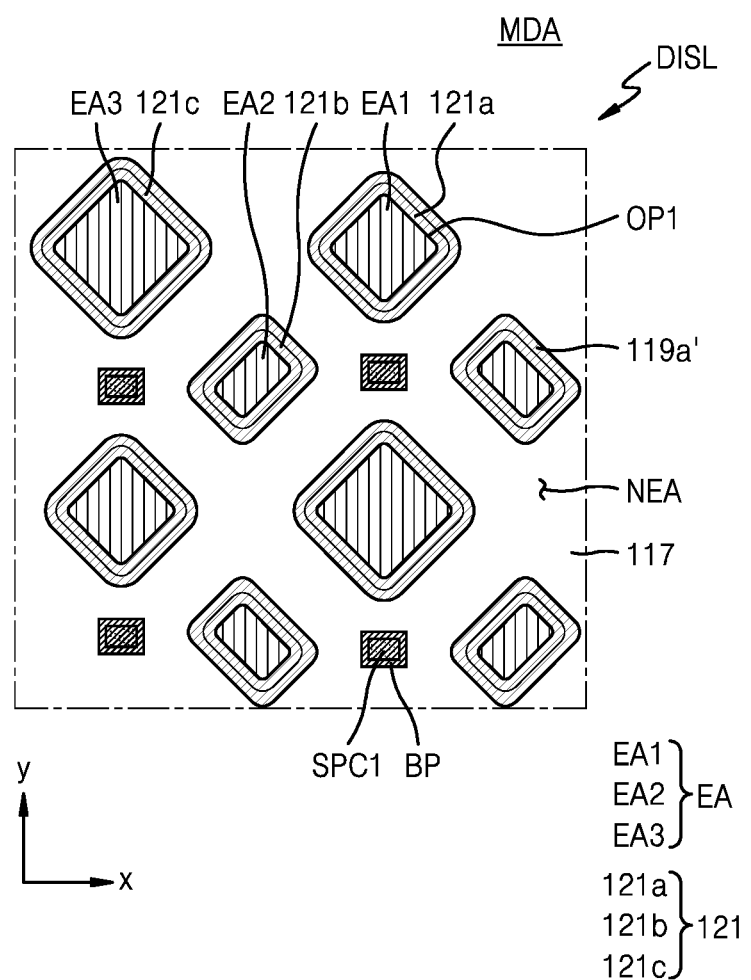
FIG. 25 is a schematic plan view of a display layer of a main display area of FIG. 24.

FIG. 24 is a schematic cross-sectional view of a portion of a display panel 10e according to an embodiment. FIG. 25 is a schematic plan view of a display layer DISL of a main display area MDA of FIG. 24.

Referring to FIGS. 24 and 25, a first pixel-defining layer 119a' in the main display area MDA may include third insulating patterns surrounding edges of the first pixel electrodes 121a, 121b, and 121c. Similarly, a second pixel-defining layer 119b' of the second component area CA2 and a third pixel-defining layer 119c' of the third component area CA3 may include first insulating patterns surrounding edges of the second electrodes 121a', 121b', and 121c'.

Fourth insulating patterns BP may be between the third insulating patterns in the main display area MDA, the fourth insulating patterns BP being spaced apart from the third insulating patterns. Second insulating patterns BP may be between the first insulating patterns in the second and third component areas CA2 and CA3, the second insulating patterns BP being spaced apart from the first insulating patterns. A corresponding first spacer SPC1 may be arranged on each of the fourth insulating patterns BP, and a corresponding second spacer SPC2 and third spacer SPC3 may be arranged on each of the second insulating patterns BP.

The first pixel-defining layer 119a', the second pixel-defining layer 119b', the third pixel-defining layer 119c', and the second insulating patterns BP each may include an opaque material. The first spacers SPC1, the second spacer SPC2, and the third spacer SPC3 may include a transparent material.

Figure 26:
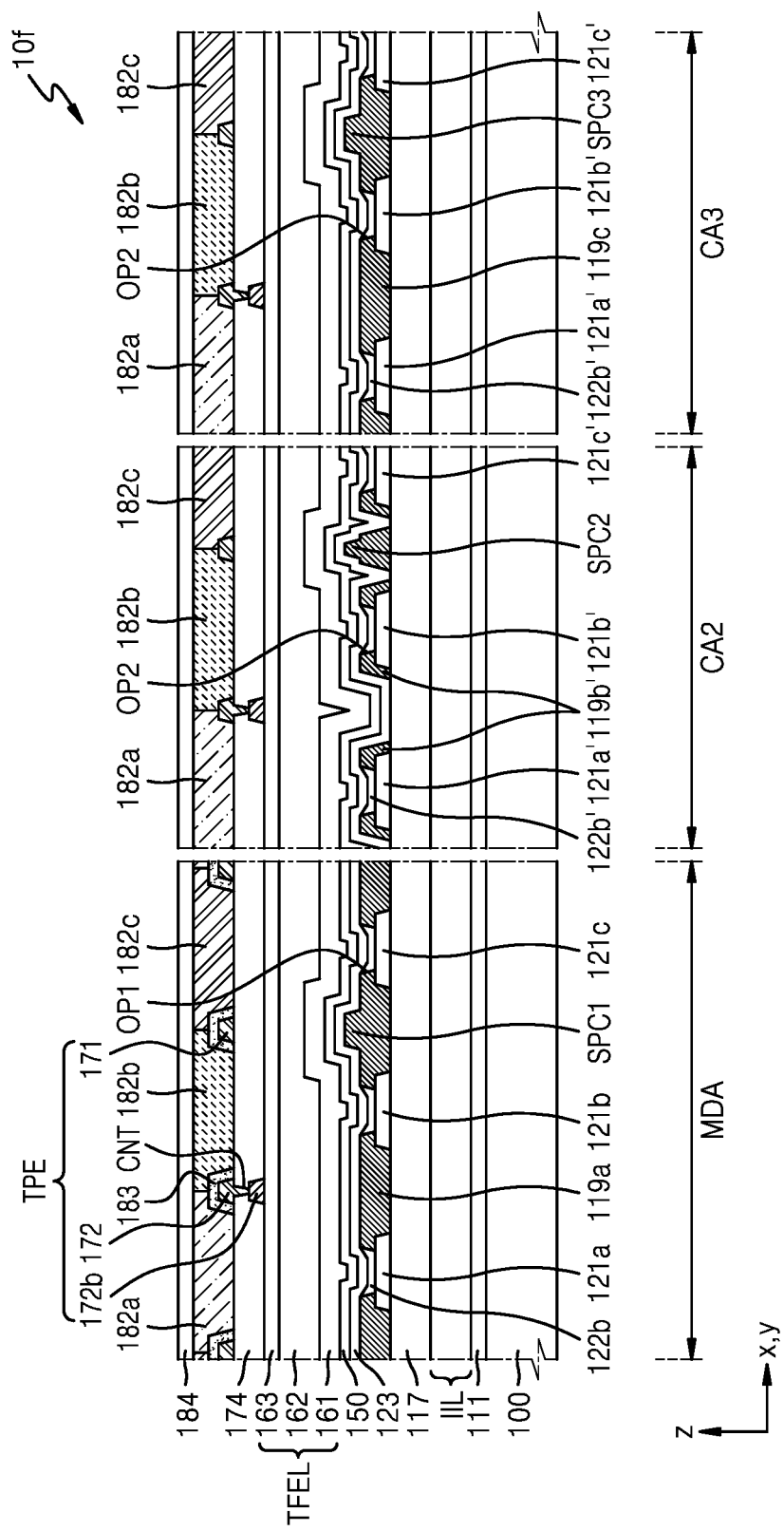
FIG. 26 is a schematic cross-sectional view of a portion of a display panel according to an exemplary embodiment of the invention.
Figure 27A:
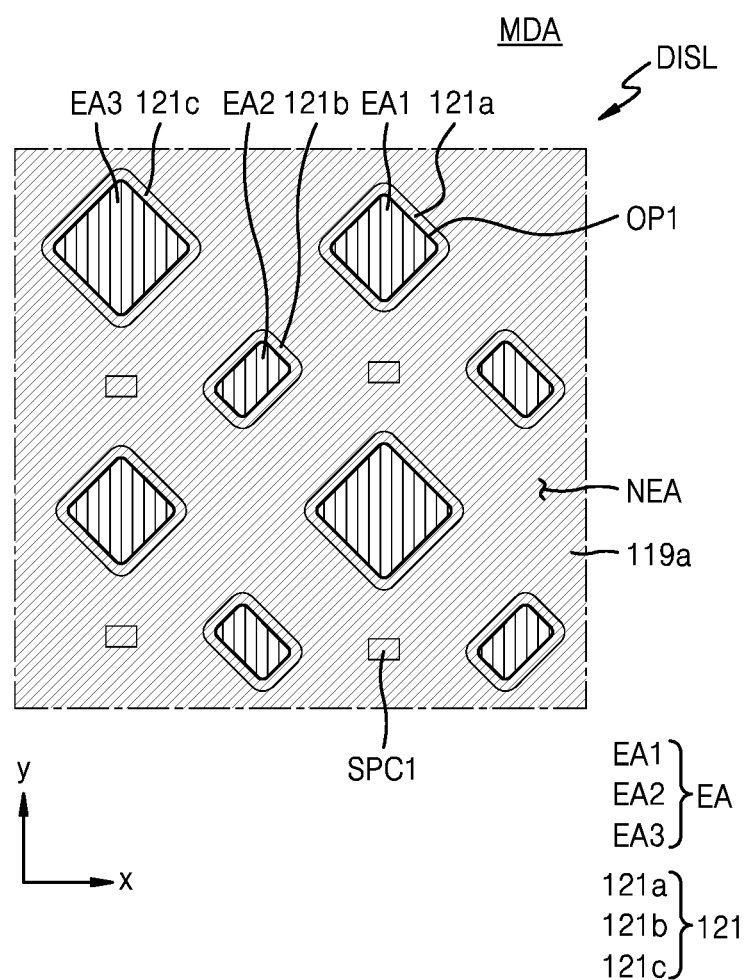
FIG. 27A is a schematic plan view of a display layer of a main display area of FIG. 26.
Figure 27B:
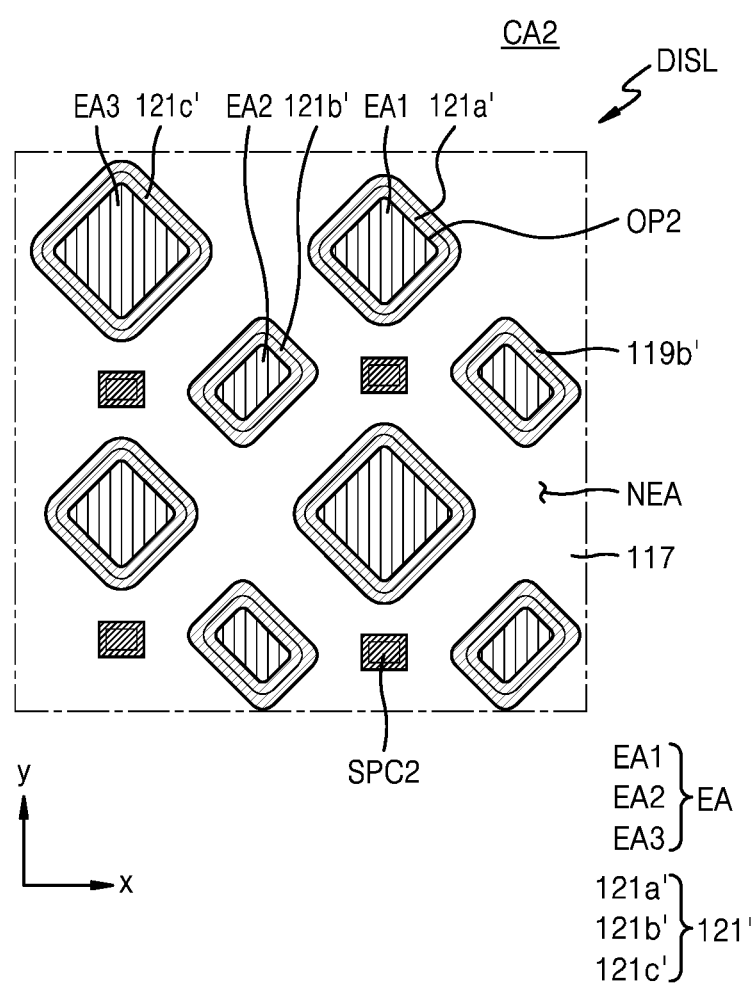
FIG. 27B is a schematic plan view of a display layer of a second component area of FIG. 26.

FIG. 26 is a schematic cross-sectional view of a portion of a display panel 10f according to an embodiment. FIG. 27A is a schematic plan view of a display layer DISL of a main display area MDA of FIG. 26. FIG. 27B is a schematic plan view of a display layer DISL of a second component area CA2 of FIG. 26.

Referring to FIGS. 26 and 27A, the first pixel-defining layer 119a in the main display area MDA may cover edges of the first pixel electrodes 121a, 121b, and 121c and may have a step with a partially different height. A protruding portion of the first pixel-defining layer 119a, which is relatively high in height, may function as the first spacer SPC1. The first pixel-defining layer 119a and the first spacer SPC1 may be formed as a single body.

Similarly, the third pixel-defining layer 119c in the third component area CA3 may cover edges of the second electrodes 121a', 121b', and 121c' and may have a step with a partially different height. A protruding portion of the third pixel-defining layer 119c, which is relatively high in height, may function as the third spacer SPC3. The third pixel-defining layer 119c and the third spacer SPC3 may be formed as a single body.

Referring to FIGS. 26 and 27B, the second pixel-defining layer 119b' in the second component area CA2 may include first insulating patterns surrounding edges of the second electrodes 121a', 121b', and 121c'. The second spacer SPC2 may be between the first insulating patterns, the second spacer SPC2 being spaced apart from the first insulating patterns. The second spacer SPC2 may have a step with a different height. A height from the substrate 100 to an upper surface of a protruding portion of the second spacer SPC2, which is relatively high, may be higher than a height from the substrate 100 to an upper surface of the second pixel-defining layer 119b'.

The first pixel-defining layer 119a', the second pixel-defining layer 119b', the third pixel-defining layer 119c, the first spacer SPC1, the second spacer SPC2, and the third spacer SPC3 each may include an opaque material.

Figure 28:
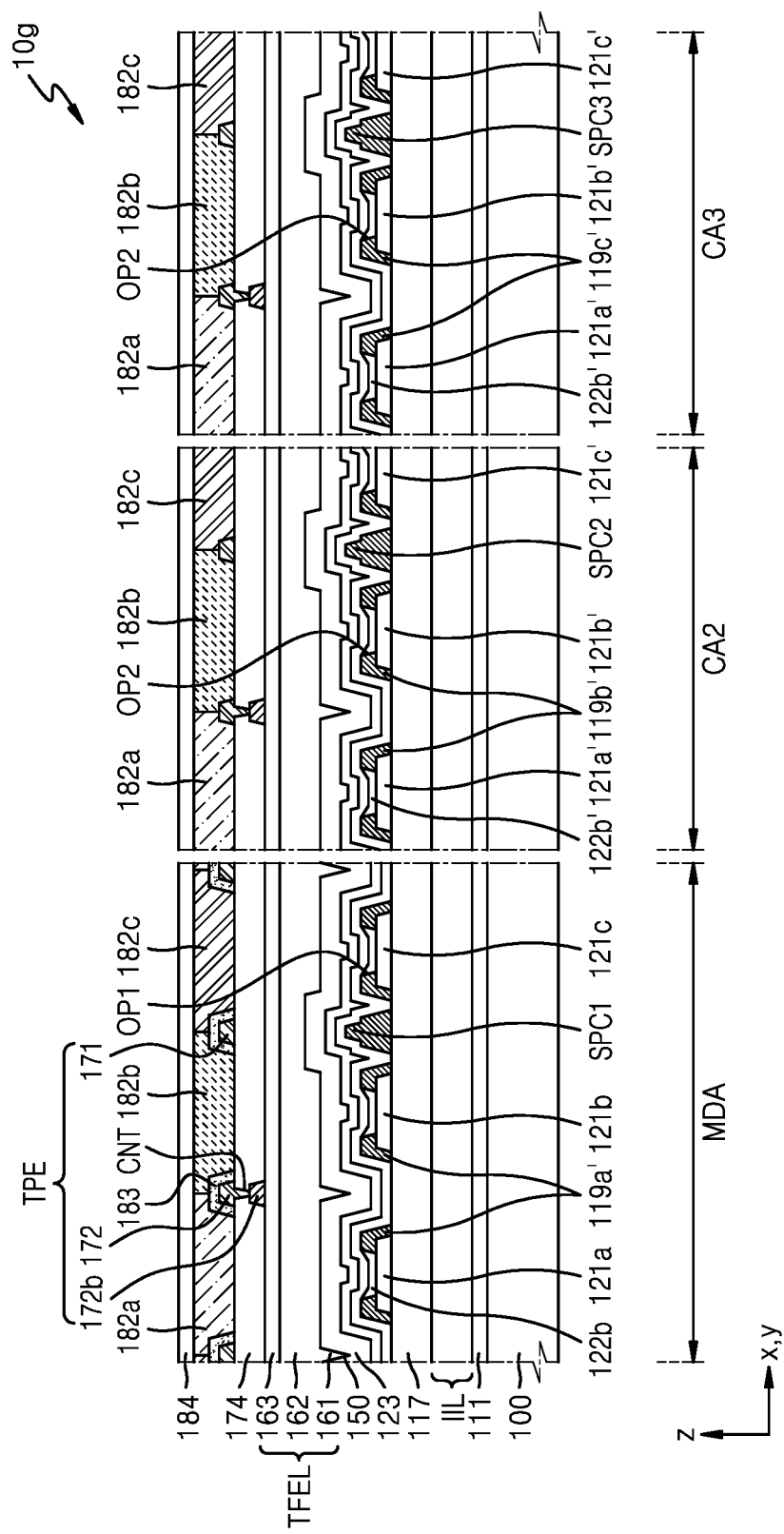
FIG. 28 is a schematic cross-sectional view of a portion of a display panel according to an exemplary embodiment of the invention.
Figure 29:
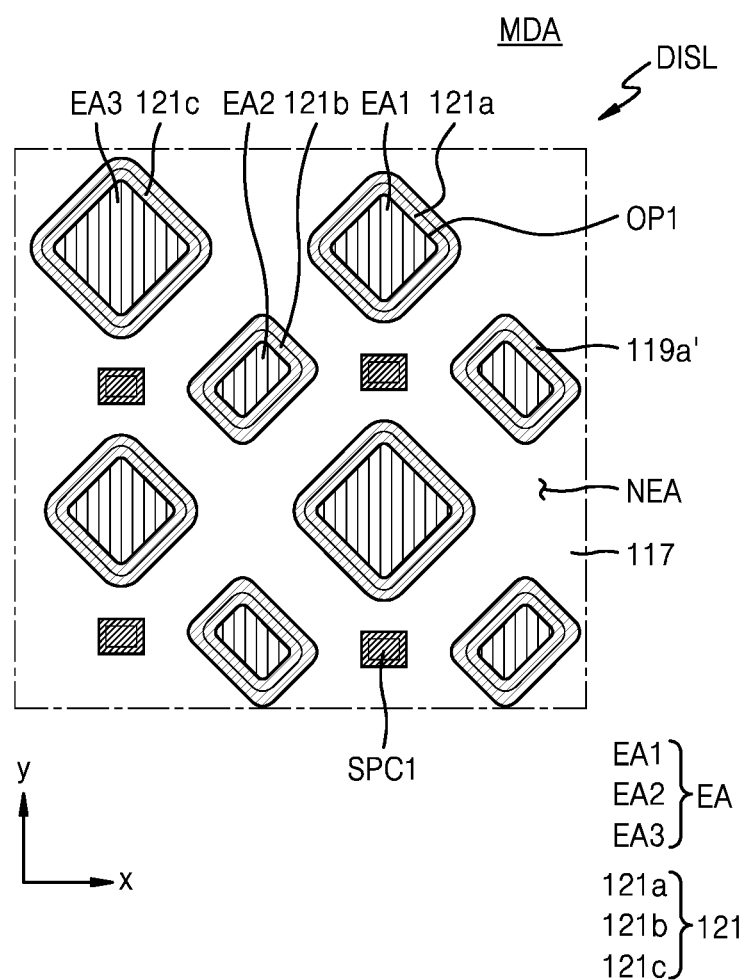
FIG. 29 is a schematic plan view of a display layer of a main display area of FIG. 28.

FIG. 28 is a schematic cross-sectional view of a portion of a display panel 10g according to an embodiment. FIG. 29 is a schematic plan view of a display layer DISL of a main display area MDA of FIG. 28.

Referring to FIGS. 28 and 29, a first pixel-defining layer 119a' in the main display area MDA may include third insulating patterns surrounding edges of the first pixel electrodes 121a, 121b, and 121c. Similarly, a second pixel-defining layer 119b' of the second component area CA2 and a third pixel-defining layer 119c' of the third component area CA3 may include first insulating patterns surrounding edges of the second electrodes 121a', 121b', and 121c'.

The first spacers SPC1 may be between the third insulating patterns in the main display area MDA, the first spacers SPC1 being spaced apart from the first insulating patterns. The second spacer SPC2 and the third spacer SPC3 may be between the first insulating patterns in the second and third component areas CA2 and CA3, respectively, the second spacer SPC2 and the third spacer SPC3 being spaced apart from the first insulating patterns. The first spacer SPC1, the second spacer SPC2, and the third spacer SPC3 may have steps with different heights. Heights from the substrate 100 to upper surfaces of protruding portions of the first to third spacers SPC1, SPC2, and SPC3 may be higher than heights from the substrate 100 to upper surfaces of the first to third pixel-defining layers 119a', 119b', and 119c'.

The first pixel-defining layer 119a', the second pixel-defining layer 119b', the third pixel-defining layer 119c', the first spacer SPC1, the second spacer SPC2, and the third spacer SPC3 each may include an opaque material.

Figure 30A:
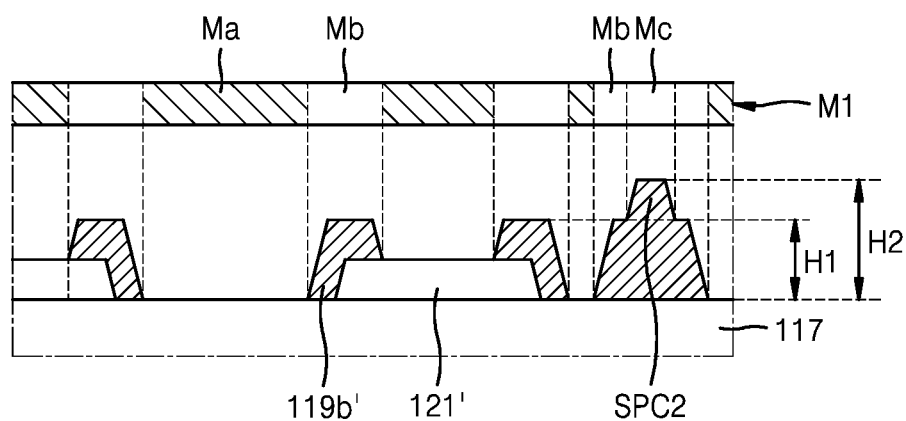
FIGS. 30A and 30B are exemplary views of a method of forming a second insulating pattern and a spacer in the display panels shown in FIGS. 26 and 28.
Figure 30B:
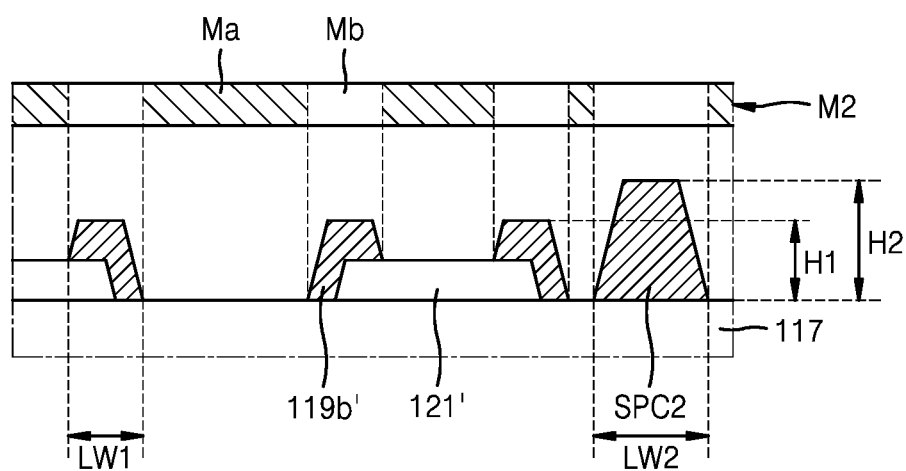

FIGS. 30A and 30B are exemplary views of a method of forming a second insulating pattern and a spacer in the display panels shown in FIGS. 26 and 28.

In an embodiment, as shown in FIG. 30A, an insulating layer having a different height for each portion may be formed by an insulating layer including a negative photosensitive material through an exposure and development process using a half-tone mask M1 including a light-shielding portion Ma, a transmissive portion Mb, and a semi-transmissive portion Mc. For example, the transmissive portion Mb may be located to correspond to the second pixel-defining layer 119b', and the transmissive portion Mb and the semi-transmissive portion Mc may be located to correspond to the second spacer SPC2 having a step.

In another embodiment, as shown in FIG. 30B, an insulating layer having a different height for each portion according to a width may be formed by an insulating layer including a negative photosensitive material in an exposure and development process using a full-tone mask M2 including a light-shielding portion Ma and a transmissive portion Mb. For example, a second width LW2 of the second spacer SPC2 may be greater than a first width LW1 of the second pixel-defining layer 119b', and thus, a height H2 of the second spacer SPC2 may be formed greater than a height H1 of the second pixel-defining layer 119b'.

According to one or more embodiments, in a display device including a main display area MDA and a component area CA, an optical functional layer including a color filter and a black matrix, and an opaque pixel-defining layer are used, and thus, a thickness of the display device may be narrowed, and reflection of external light may be reduced, compared to a display device using a polarizing plate. In addition, according to one or more embodiments, in the component area CA, an optical functional layer without a black matrix, and a transparent pixel-defining layer or an opaque pixel-defining layer having a minimal area are used, and thus, a deterioration in light transmittance (in particular, transmittance of visible light) in the component area CA due to the black matrix and the opaque pixel-defining layer may be minimized, thereby maximizing functions of a component. In addition, an image may be implemented in the component area CA without a change in image quality.

In the aforementioned embodiments, a component area in which an illuminance sensor, to which visible light is incident, is arranged and a component area in which a proximity sensor, to which infrared light is incident, is arranged have been described as examples, but a component area in which a camera, to which visible light and/or infrared light are incident, is arranged may also be similarly applied.

As described above, in the display panel and the display device according to the present embodiments, the color filter is used to thereby prevent reflection of external light and minimize a thickness of the display device. A pixel-defining layer and a spacer in a component area in which a component is arranged are configured differently from a pixel-defining layer and a spacer in a main display area, thereby ensuring transmittance in the component area. However, the scope of the embodiments is not limited to the above effect.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device including a main display area in which main display elements are arranged and a component area in which auxiliary display elements and a transmission area are arranged, the display device comprising:
   a first pixel-defining layer arranged in the main display area, the first pixel-defining layer disposed between first pixel electrodes of the main display elements;
   a second pixel-defining layer arranged in the component area, the second pixel-defining layer disposed between second pixel electrodes of the auxiliary display elements;
   a black matrix arranged on the main display elements, the black matrix disposed around emission areas of the main display elements; and
   color filters arranged on the main display elements and the auxiliary display elements, the color filters corresponding to the emission areas of the main display elements and emission areas of the auxiliary display elements, respectively,
   wherein the black matrix is not disposed in the component area.

2. The display device of claim 1, wherein the first pixel-defining layer includes an opaque material, and
   the second pixel-defining layer includes a transparent material.

3. The display device of claim 2, further comprising:
   a first spacer disposed on the first pixel-defining layer;
   an insulating pattern arranged in the component area; and
   a second spacer disposed on the insulating pattern.

4. The display device of claim 3, wherein the second pixel-defining layer covers the insulating pattern, and
   the second spacer is a portion of the second pixel-defining layer, which is arranged on the insulating pattern.

5. The display device of claim 3, wherein the second pixel-defining layer is disposed apart from the insulating pattern, and
   a slit surrounds the insulating pattern between the second pixel-defining layer and the insulating pattern.

6. The display device of claim 2, further comprising:
   a first spacer disposed on the first pixel-defining layer; and
   a second spacer which is a portion of the second pixel-defining layer, the second spacer being a portion protruding from the second pixel-defining layer.

7. The display device of claim 1, wherein each of the first pixel-defining layer and the second pixel-defining layer includes an opaque material.

8. The display device of claim 7, wherein the second pixel-defining layer includes first insulating patterns surrounding edges of the second pixel electrodes.

9. The display device of claim 8, further comprising:
   a first spacer disposed on the first pixel-defining layer;
   a second insulating pattern disposed between the first insulating patterns, the second insulating pattern disposed apart from the first insulating patterns; and
   a second spacer disposed on the second insulating pattern.

10. The display device of claim 9, wherein the second insulating pattern includes an opaque material, and
    each of the first spacer and the second spacer includes a transparent material.

11. The display device of claim 8, wherein the first pixel-defining layer includes third insulating patterns surrounding edges of the first pixel electrodes.

12. The display device of claim 11, further comprising:
    a fourth insulating pattern disposed between the third insulating patterns, the fourth insulating pattern disposed apart from the third insulating patterns;
    a first spacer disposed on the fourth insulating pattern;
    a second insulating pattern disposed between the first insulating patterns, the second insulating pattern disposed apart from the first insulating patterns; and
    a second spacer disposed on the second insulating pattern.

13. The display device of claim 12, wherein each of the second insulating pattern and the fourth insulating pattern includes an opaque material, and
    each of the first spacer and the second spacer includes a transparent material.

14. The display device of claim 8, further comprising:
    a first spacer which is a portion of the first pixel-defining layer, the first spacer being a portion protruding from the first pixel-defining layer; and
    a second spacer disposed between the first insulating patterns, the second spacer disposed apart from the first insulating patterns and including portions having different heights.

15. The display device of claim 14, wherein the second spacer includes an opaque material.

16. The display device of claim 11, further comprising:
    a first spacer disposed between the third insulating patterns, the first spacer disposed apart from the third insulating patterns and including portions having different heights; and
    a second spacer disposed between the first insulating patterns, the second spacer disposed apart from the first insulating patterns and including portions having different heights.

17. The display device of claim 16, wherein each of the first spacer and the second spacer includes an opaque material.

18. The display device of claim 1, wherein an edge of the second pixel-defining layer in the component area overlaps an edge of the first pixel-defining layer in the main display area.

19. A display device including a main display area in which main display elements are arranged and a component area in which auxiliary display elements and a transmission area are arranged, the display device comprising:
- a first pixel-defining layer arranged in the main display area and covering edges of first pixel electrodes of the main display elements;
- a first spacer disposed between the first pixel electrodes of the main display elements;
- a second pixel-defining layer arranged in the component area and covering edges of second pixel electrodes of the auxiliary display elements; and
- a second spacer disposed between the second pixel electrodes of the auxiliary display elements,
- wherein the second spacer and the second pixel-defining layer form an integral structure and include the same material.

20. The display device of claim 19, further comprising an insulating pattern between the second pixel electrodes of the auxiliary display elements,
- wherein the second pixel-defining layer covers the insulating pattern, and the second spacer overlaps the insulating pattern.

21. The display device of claim 19, further comprising:
- a thin-film encapsulation layer arranged on the main display elements and the auxiliary display elements;
- a black matrix arranged on the thin-film encapsulation layer, the black matrix disposed around emission areas of the main display elements; and
- color filters arranged on the thin-film encapsulation layer, the color filters corresponding to the emission areas of the main display elements and emission areas of the auxiliary display elements, respectively.

22. The display device of claim 19, wherein the material of the first pixel-defining layer is different from the material of the second pixel-defining layer.

23. The display device of claim 19, wherein the material of the first spacer is different from the material of the first pixel-defining layer.

24. A display device including a main display area in which main display elements are arranged and a component area in which auxiliary display elements and a transmission area are arranged, the display device comprising:
- a first pixel-defining layer arranged in the main display area and covering edges of first pixel electrodes of the main display elements;
- a first spacer disposed between the first pixel electrodes of the main display elements;
- a second pixel-defining layer arranged in the component area and covering edges of second pixel electrodes of the auxiliary display elements; and
- a second spacer disposed between the second pixel electrodes of the auxiliary display elements,
- wherein the second pixel-defining layer includes insulating patterns surrounding the edges of the second pixel electrodes, and the insulating patterns are spaced apart from each other in a plan view.

25. The display device of claim 24, wherein the second spacer is disposed between the insulating patterns and includes portions having different heights.

26. The display device of claim 24, further comprising:
- a thin-film encapsulation layer arranged on the main display elements and the auxiliary display elements;
- a black matrix arranged on the thin-film encapsulation layer, the black matrix disposed around emission areas of the main display elements; and
- color filters arranged on the thin-film encapsulation layer, the color filters corresponding to the emission areas of the main display elements and emission areas of the auxiliary display elements, respectively.

* * * * *